US009471938B2

(12) United States Patent
Rolleston et al.

(10) Patent No.: US 9,471,938 B2
(45) Date of Patent: Oct. 18, 2016

(54) METHOD FOR FULFILLMENT OF KIT AND APPARATUS ASSOCIATED THEREWITH

(75) Inventors: Robert John Rolleston, Rochester, NY (US); Jeffrey David Kingsley, Macedon, NY (US); Alan Thomas Coté, East Rochester, NY (US); Mary Ann Sprague, Macedon, NY (US)

(73) Assignee: Xerox Corporation, Norwalk, CT (US)

( * ) Notice: Subject to any disclaimer, the term of this patent is extended or adjusted under 35 U.S.C. 154(b) by 1256 days.

(21) Appl. No.: 13/417,772

(22) Filed: Mar. 12, 2012

(65) Prior Publication Data

US 2013/0238288 A1     Sep. 12, 2013

(51) Int. Cl.
*G06F 17/50* (2006.01)
*G06Q 30/06* (2012.01)
*G06T 19/00* (2011.01)
*G06F 9/50* (2006.01)

(52) U.S. Cl.
CPC .......... *G06Q 30/06* (2013.01); *G06Q 30/0621* (2013.01); *G06Q 30/0641* (2013.01); *G06T 19/00* (2013.01); *G06F 9/5072* (2013.01); *G06F 17/5009* (2013.01)

(58) Field of Classification Search
CPC ............... G06F 17/5009; G06F 17/24; G06F 17/30482; G06F 17/5086; G06F 3/082
USPC .................................. 703/4, 7, 2, 1; 717/103
See application file for complete search history.

(56) References Cited

U.S. PATENT DOCUMENTS

| 6,711,798 B2 | 3/2004 | Sanders et al. |
| 6,957,186 B1* | 10/2005 | Guheen ............... G06Q 90/20 705/323 |
| 2006/0114490 A1 | 6/2006 | Rolleston |
| 2011/0126168 A1* | 5/2011 | Ilyayev ............... G06F 9/5072 717/103 |
| 2012/0271596 A1* | 10/2012 | Hadley et al. ................... 703/1 |

OTHER PUBLICATIONS

Qingjin Peng, NPL, "Virtual reality technology in product design and manufacturing", Jun. 27, 2007 (google).*
Kevin W. Lyons, NPL, "Virtual Assembly Using Virtual Reality Techniques", Sep. 1996.*
Cummings et al., Industry Trends in Fulfillment, Finishing and Distribution, Printing Industry Center at Rochester Institute of Technology, Rochester, NY, No. PICRM-2004-03, Dec. 2004 (44 Pages).

(Continued)

Primary Examiner — Thai Phan
(74) Attorney, Agent, or Firm — Fay Sharpe LLP

(57) ABSTRACT

A method for fulfillment of a kit includes a) generating a 3D virtual simulation of a kit using a computer animation tool in a kit fulfillment environment after receiving a kit request from a customer, the 3D virtual simulation formed using 3D virtual models of objects in the kit and reflecting a spatial layout of components packed in a receptacle, the 3D virtual simulation including an interactive animation that dynamically controls a visual rendering of the 3D virtual simulation in response to a user at a user device selectively manipulating the kit or an object; b) providing the customer with remote access to the 3D virtual simulation to use a remote user device to control the visual rendering for a review of the kit; and c) releasing the kit for production and fulfillment of the request after receiving an approval from the customer in conjunction with the review.

20 Claims, 13 Drawing Sheets

(56) References Cited

OTHER PUBLICATIONS

Rolleston, Higher Dimensions of Documents, Xerox Innovation Group, Inside Innovation at Xerox, Palo Alto, CA, Apr. 28-29, 2008 (7 Pages).

Mimeo Customization Solutions, Copyright 1999-2012, Mimeo, Inc., Printed From www.mimeo.com/products/customization-solutions/ on Jan. 31, 2012 (2 Pages).

Setting Up a Document, Fedex Office, Apr. 1, 2011, Printed From printonline.fedex.com/v2.3.0/help/retailsetupnewdoclearnmore.pdfon Jan. 31, 2012 (1 Page).

Web-to-Print Marketing and HR Solutions, Copyright 2012, Nowdocs, Printed From nowdocs.com/content/85/marketing-hr-solutions on Jan. 31, 2012 (1 Page).

Web-to-Print Document Solutions, Copyright 2012, Nowdocs, Printed From nowdocs.com/content/84/document-solutions on Jan. 31, 2012 (3 Pages).

Warehousing & Kitting, Copyright 1999-2012, Mimeo, Inc., Printed From www.mimeo.com/products/warehousing-kitting.php on Jan. 31, 2012 (2 Pages).

\* cited by examiner

METHOD FOR FULFILLMENT OF KIT AND APPARATUS ASSOCIATED THEREWITH

BACKGROUND

The present exemplary embodiment relates generally to a method for fulfillment of a kit and an apparatus for use in fulfillment of a kit. The kit is viewed as multiple objects packaged into a deliverable unit. The method finds particular application in managing kit development in response to a kit request from a customer. The kit request can include various properties and behaviors desired by the customer for the kit and for objects within the kit. The kit development can include various processes to evolve the kit request into a specification and design. For example, the kit development includes generating a 3D virtual simulation of the requested kit that can be accessed and reviewed by the customer for approval prior to production and fulfillment. The apparatus may provide a kit fulfillment environment with a communication subsystem for exchanges between the customer and kit provider, storage devices for storing information associated with kit development, and computer devices with access to various development tools to form and manage the development information. It is to be appreciated that the various features of the exemplary embodiments described herein may be reconfigured in any suitable combination to form further embodiments.

The act of designing and specifying a "Kit" or "Fulfillment" Pack is today grounded in the production of physical samples, concepts, and prototypes. These physical samples must be manually produced, and then shipped to any interested parties. These processes are inherently costly, time consuming, and quite often require face-to-face meetings for discussions and collaborations.

Current virtual 3D rendering systems work only with single pieces, and not with collections of multiple pieces that must be spatially coordinated. There is a need for using virtual 3D rendering systems and other advanced technologies in conjunction with kit fulfillment to reduce development costs, reduce time-to-market, improve customer satisfaction, and improve efficiency of various other aspects of kit fulfillment.

INCORPORATION BY REFERENCE

The following documents are fully incorporated herein by reference: 1) U.S. Pat. App. Publication No. 2006/0114490 to Rolleston, Ser. No. 11/001,431, filed Dec. 1, 2004; 2) U.S. Pat. No. 6,711,798 to Sanders et al., Ser. No. 09/800,044, filed Mar. 5, 2001; and 3) Cummings et al., Industry Trends in Fulfillment, Finishing and Distribution, Printing Industry Center at Rochester Institute of Technology, Rochester, N.Y., No. PICRM-2004-03, December 2004 (44 pages).

BRIEF DESCRIPTION

In one aspect, a method for fulfillment of a kit in provided. In one embodiment, the method includes: a) transforming an unstructured description of a kit into a structured description after receiving a request for the kit from a customer, wherein the kit comprises a plurality of objects which include a plurality of components and one or more receptacle, wherein the structured description includes a parts list identifying the kit and the plurality of objects; b) transforming the structured description of the kit into a design specification using a kit design tool in a kit fulfillment environment, the kit fulfillment environment comprising at least one computer device and a kit repository storage device, wherein the design specification includes the parts list and further defines the kit and objects using part numbers, descriptive properties, and descriptive behaviors, including 3D virtual models of objects in the kit, wherein the design specification is stored in the kit repository storage device; c) generating a 3D virtual simulation of the kit based at least in part on the design specification using a computer animation tool in the kit fulfillment environment, wherein the 3D virtual simulation is formed using the 3D virtual models of objects in the kit, wherein the 3D virtual simulation reflects a select spatial layout of the plurality of components packed in the one or more receptacle and includes an interactive animation that dynamically controls a visual rendering of the 3D virtual simulation in response to a user at a user device selectively manipulating the kit or at least one object, wherein the 3D virtual simulation is stored in the kit repository storage device; d) providing the customer with remote access to the 3D virtual simulation such that the customer can use a remote user device to control the visual rendering for a final review of the kit; and e) releasing the kit for production and fulfillment of the request after receiving a final approval from the customer in conjunction with the final review.

In another embodiment, the method for fulfillment of a kit includes: a) generating a 3D virtual simulation of a kit using a computer animation tool in a kit fulfillment environment after receiving a request for the kit from a customer, the kit fulfillment environment comprising at least one computer device and a kit repository storage device, wherein the kit comprises a plurality of objects which include a plurality of components and one or more receptacle, wherein the 3D virtual simulation is formed using 3D virtual models of objects in the kit, wherein the 3D virtual simulation reflects a select spatial layout of the components packed in the one or more receptacle and includes an interactive animation that dynamically controls a visual rendering of the 3D virtual simulation in response to a user at a user device selectively manipulating the kit or at least one object, wherein the 3D virtual simulation is stored in the kit repository storage device; b) providing the customer with remote access to the 3D virtual simulation such that the customer can use a remote user device to control the visual rendering for a final review of the kit; and c) releasing the kit for production and fulfillment of the request after receiving a final approval from the customer in conjunction with the final review.

In another aspect, an apparatus for use in fulfillment of a kit is provided. In one embodiment, the apparatus includes: a customer communication subsystem for receiving a request for a kit from a customer, wherein the kit comprises a plurality of objects which include a plurality of components and one or more receptacle; a kit repository storage device; and at least one computer device in operative communication with the customer communication subsystem and kit repository storage device. The at least one computer device for use in conjunction with: a) transforming an unstructured description of the kit into a structured description in response to the customer communication subsystem receiving the request for the kit, wherein the structured description includes a parts list identifying the kit and the plurality of objects, b) transforming the structured description of the kit into a design specification using a kit design tool, wherein the design specification includes the parts list and further defines the kit and objects using part numbers, descriptive properties, and descriptive behaviors, including 3D virtual models of objects in the kit, wherein the design specification is stored in the kit repository storage device, and c) generating a 3D virtual simulation of the kit based at least in part on the design specification using a computer animation tool, wherein the 3D virtual simulation is formed using the 3D virtual models of objects in the kit, wherein the 3D virtual simulation reflects a select spatial layout of the plurality of components packed in the one or more receptacle and includes an interactive animation that dynamically controls a visual rendering of the 3D virtual simulation in response to a user at a user device selectively manipulating the kit or at least one object, wherein the 3D virtual simulation is stored in the kit repository storage device. The customer is provided with remote access to the 3D virtual simulation via the customer communication subsystem such that the customer can use a remote user device to control the visual rendering for a final review of the kit. The kit is released for production and fulfillment of the request after receiving a final approval from the customer via the customer communication subsystem in conjunction with the final review.

DETAILED DESCRIPTION

Figure 1:
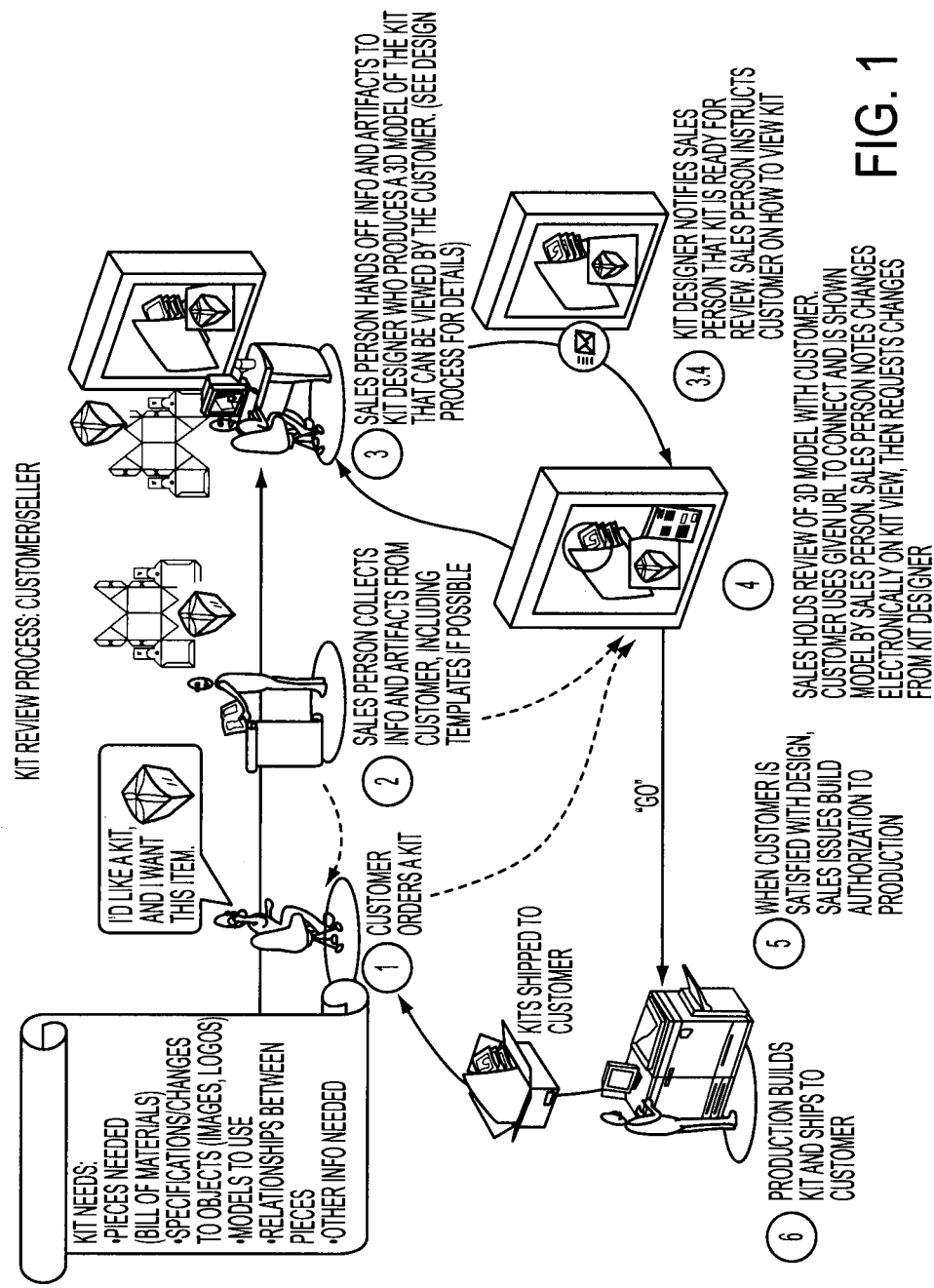
FIG. 1 is a flow diagram of an exemplary embodiment of a process for fulfillment of a kit.

This disclosure describes various embodiments of methods for fulfillment of a kit and an apparatus for use in fulfillment of a kit. The kit is viewed as multiple objects (e.g., products or components) packaged into a deliverable unit. The kit may also be characterized as a fulfillment pack. The method is associated with managing kit development in response to a kit request from a customer. The kit request may be associated with an unstructured description of the kit. The kit development includes generating a 3D virtual simulation of the requested kit with an interactive animation that dynamically controls a visual rendering of the simulation. The visual rendering can be remotely accessed and controlled by the customer using a user device to review and approve the kit prior to production and fulfillment.

Kit development may also include formulation of a structured description of the kit prior to generation of the 3D virtual simulation. The structured description may also be accessed and reviewed by the customer for approval prior to advancement to the next stage of kit development. A design specification may be formed during kit development prior to generation of the 3D virtual simulation. The customer may access and review the design specification for approval prior to advancement to the next stage of kit development.

The apparatus may provide a kit fulfillment environment with a communication subsystem for exchanges between the customer and kit provider, storage devices for storing information associated with kit development, and computer devices with access to various development tools to form and manage the development information. It is to be appreciated that the various features of the exemplary embodiments described herein are re-configurable in any suitable combination to form further embodiments.

This disclosure describes a system to request, design, and manage the specification of a finished pack or kit. The process for fulfillment of a kit including using virtual 3D renderings and manipulations of the assorted kit pieces. The process for fulfillment of the kit accommodates the roles of customer (requesting the job), sales (internalizing the customer request), designer (laying out the relations of the 3D virtual models and customizing said pieces with the customer specifics), builder (creating any needed 3D models), and collaborative approval between sales/customer.

The process of specifying, designing, producing, and overall management of a kit in response to a customer request is often referred to as fulfillment. The development processes described herein use virtual 3D renderings and manipulations of the assorted pieces of a kit as a coordinated set of pieces. In one embodiment, a Unity Game Engine may be used to control the 3D virtual scene and to enable multi-user collaboration. Other technologies and tools are also viable, such as Flash, Java3D, SilverLight, and HTML5. Existing systems today, such as mimeo.com, FedExOffice, NowDocs, etc., work only with single pieces. These existing system do not work with collections of multiple pieces that must be spatially aligned for packing into a single unit.

Composed Services or Roles

It is convenient to think of the various steps in the work process as being services or roles performed by players. The players/roles do not have to be unique persons, nor do the services have to be stand-alone; but rather these functional aspects can be assembled in different ways for different instantiations and deployments. Each of these functions operates on a data structure (referred to as the KitViz Container), which over time embodies the full descriptive and parameterized definition of the finished product.

Figure 2:
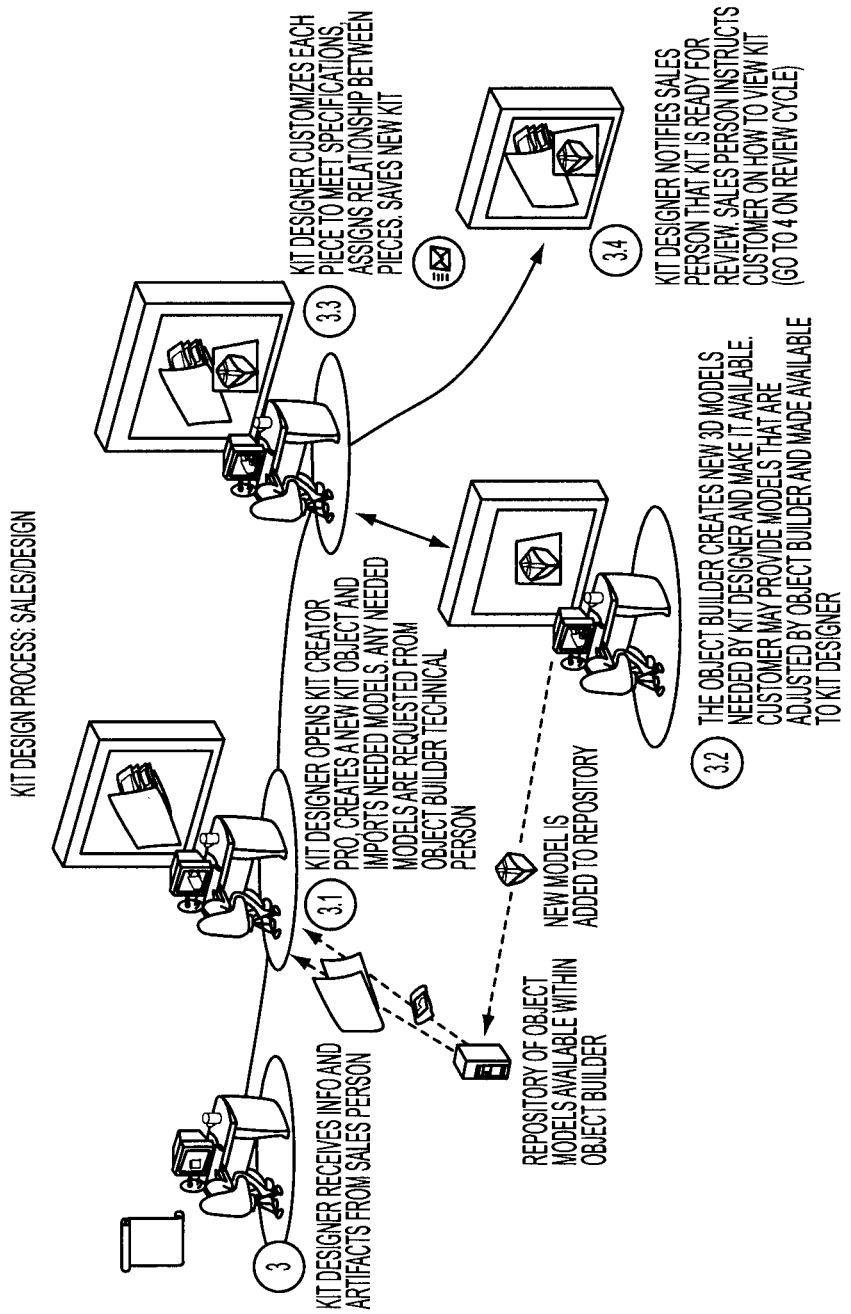
FIG. 2 is a flow diagram of an exemplary embodiment of a process for designing a kit.

These processes and roles are captured in FIGS. 1 and 2. FIG. 1 shows interactions between a customer (i.e., a person paying for the finished product) and a seller (e.g., sales agent acting as interface to customer). FIG. 2 shows interactions internal kit development or kit production facility in support of building a 3D virtual scene as specified by the sales agent.

KitViz Container

The KitViz Container is the core data source for the workflow used in the design, approval, and production of the KitViz kit fulfillment. The use of a top-level manifest and the separation of sections is somewhat based on various stages of the work flow, or the process of requesting, defining, and visualizing a kit. This also includes a simple audit trail.

The KitViz Container is divided into several sections, each of which has a specific purpose in the kit fulfillment workflow. The sections include: 1) Manifest, 2) Customer Input, 3) Sales Request, 4) Kit Specification, 5) Assembly Definition, and 6) Assembly Process.

The Manifest includes Contents and Audit trail of the Kit Container. The Customer Input includes information about original customer request. The Sales Request includes a formalized definition, such as a list of all the pieces in the concept and the associated messaging content or placeholder samples. The Sales Request should be sufficient to further define visualizations and calculate parts costs. The Kit Specification includes complete parameterization of all the concept pieces and the messaging content for the pieces. The Kit Specification should be sufficient to create a 3D model with message content for each piece. The Assembly Definition includes how the pieces fit together. The Assembly Definition should be sufficient to place all the pieces in at least one configuration and may have multiple configurations. The Assembly Process includes how the pieces move and connect to one another from Assembly Definition to another.

The KitViz system includes a set of tools, each of which may have a different type of visualization of one or more sections of the KitContainer and will perform some operation(s) on the content of the KitContainer. So perhaps the Sales Request will list a part by name or sales catalog number (e.g. "DVD"+Company Logo), and then the Kit Specification will further define the kit content, including visualization (e.g. DVD.unitypackage). In any case, each section referenced by the Manifest will have the content it needs to operate. Ideally, all the content can be traced backward (to the original Customer Input), and forward (at least as far as the workflow has been defined).

Manifest

The Manifest describes the contents of the KitContainer and includes any audit information. It is considered to be the entry point into the KitContainer. In some cases the actual information is within the Manifest. In other cases, the Manifest has references to the actual data. This allows for a single component to create and consume the Manifest and a set of adaptors that may be shared for working with the contents of the Manifest. The adaptors may be combined in a standalone service or distributed in a set of services (e.g., various applications). The purpose of the adaptor is to access information from some appropriate source and provide it to the current application within the kit fulfillment workflow. The adaptor may also preserve the state of the current application for future use.

The audit information is intended to enable certain parts of the workflow to indicate changes. For example, the buyer may indicate a part needs to be different in audit information without being directly tied to the current design or a 3D asset. The audit information contains a list of change requests. The change request may provide details concerning any request to make changes to the kit design. The request will have information about the person making the request, the actual change, and the status of the change.

Customer Input

The Customer Input is mostly unstructured data and information collected from the customer to describe what the customer wants. This section includes one or more references to typical containers (as an Excel spreadsheet or PDF). The value of this section is that anyone in the workflow can always get back to the original request, such as the actual request made by the customer.

This section could also contain customer information such as: i) business name and address, ii) contact name, address, phone, email, and iii) artwork sources (e.g., URL of a repository of image files) to be used on items in the kit.

Sales Request

The Sales Request is structured and organized information about all the pieces within the kit, content sources for the needed text messaging, and a formal description of how the pieces relate spatially to one another. This section would be, more or less, created manually by the sales representative based on viewing the information in the Customer Input section and during discussions with the customer. The sales representative could use some tool with a convenient GUI to create this section. It is not necessarily auto-generated from the Customer Input section. However, the functionality to implement auto-generation of the Sales Request from the Customer Input could be implemented as an option or a standard feature.

A key piece of the Sales Request section is a parts list. The parts list includes either a list of actual parts or reference to external parts. Each of the parts is known by a unique part identifier. Each part may be linked to the Kit Provider's inventory control system. In other words, the part identifiers can be built in (i.e., internal) to the tools and applications that operate on the Kit Container and known within the Kit Fulfillment business. Each part may be listed multiple times in the Parts List. For example, each part may be listed each time it appears in a different assembly along with quantity information for the corresponding assembly or each part may be listed each time it appears in each assembly without quantity information. The identifier that is used internal to the Kit Container is also used to relate the part to other parts in the Kit Container. The Parts List includes a basic description of the individual item to be added to the kit. The physical container used to enclose the kit may be included in the Parts List.

Kit Specification

The Kit Specification is a formal parameterization of the "Sales Request." For example, the format for the Kit Specification may include, but is not exclusively limited to, any combination of the following: i) part numbers, ii) part models, iii) properties of parts (appearance parameters, textures, references to content), and iv) references to "Sales Request" information used to parameterize the properties.

At this point, any part can be individually examined with all of its appearance content in relation to the Parts List and Visualization. The Parts List information may include: i) part identifier, ii) part description (human readable), and iii) URL to part list with well-defined structure. The Parts List information may optionally include any combination of the following: i) vendor Information (vendor name, address, contact, vendor part number, vendor cost), ii) part weight, and iii) part cost. The Visualization may provide a reference to a 3D asset for each part.

The Visualization section of the manifest is used to identify the rendering assets needed to visualize any piece within the kit using a rendering application. Typically, these are 3D rendering assets used by a particular 3D rendering engine and references to external digital media. In order to do the actual visualization, the 3D rendering assets are combined with spatial information and customization information. Free form manipulation of the parts may be allowed by user gestures restricted by natural physical constraints (e.g. parts cannot move through the side of a box).

Assembly Definition

The Assembly Definition is the spatial location of parts, relative to one another, in some configuration of the entire kit. At this point, the parts can be placed into a group with spatial relationships to each other or some common reference point. These spatial relationships can be at any stage of "packing." Different parts can be at different stages of "assembly." For example, Box-A (which includes items A-1 thru A-N) is closed, but is under Box-B (which include items B-1 thru B-N) which is not packed in an "unpacked" state.

The format for the Assembly Definition is a list of N "Assemblies," each of which defines the location of nodes in the assembly tree. Any leaves with undefined locations may not be able to be rendered. For example, the assembly and layout information may include: i) part used as anchor (optional as all parts may be relative to scene origin), ii) translation and rotation of each part relative to the anchor or its parent, iii) assembly/disassembly order, and iv) part customization items (part, area of customization, reference to content).

Assembly Process

The Assembly Process is a specification of how the pieces move when transitioning between "packed" and "unpacked" (e.g. how pieces move when going from one "Assembly Definition" to another "Assembly Definition"). This section contains instructions to assemble and disassemble the kit. The instructions provide information concerning the packing of the pieces of the kit and the order and direction that the end user would see during the (dis)assembly process. The format for the Assembly Process may be a set of paths, possibly driven by physics, or a scheme that provides transitions between adjacent "Assembly Definitions".

Functional Processes, Roles, or Players

The functional roles, role characteristics, inputs, and outputs associated with the workflow in the design, approval, and production of the KitViz Container are provided in the following paragraphs. The functional roles can also be referred to as players and include the customer, sales representative, kit designer, and object builder.

The customer is responsible for describing the desired kit, supplying any custom objects, and defining properties of the parts (e.g. color, texture, logo). The skill levels required for the customer are non-technical skills. The tools provided for the customer may include a browser or possibly an application supplied by the Kit Producer. The inputs associated with the customer may include: i) desire, ii) reference from Seller with request to review, and iii) URLs. The outputs associated with the customer may include: i) unstructured kit description and ii) review kits with sales. The "unstructured kit description" output may include: i) parts, ii) customization of parts, iii) descriptive properties (e.g., color, textures, size, etc.), and iv) descriptive behaviors (e.g., how parts are to be placed relative to one another). The "review kits with sales" output may include making comments or changes.

The sales representative is responsible for transforming unstructured request from a buyer (e.g., customer) into a structured collection of information and artifacts. The structured information may be in textual form, including lists, part identifiers, etc. The skill levels required for the sales representative are medium technical skills, requirements management skills, and customer relations management (CRM) skills. The tools provided for the sales representative may include a browser or possibly applications provided by the company. The inputs associated with the sales representative may include: i) requests from buyer, ii) artifacts from buyer, iii) kits from kit repository, and iv) references from kit designer. The "requests from buyer" inputs may include: i) descriptions of finished kit and ii) changes to kits. The "artifacts from buyer" input may include: i) 3D models, ii) 2D images, textures, logos, and iii) documents (PDF, Word, etc.). The outputs associated with the sales representative may include: i) structured kit description and ii) review kits with buyer(s). The "structured kit description" output may include: i) parts list, ii) customization of parts, iii) descriptive properties (e.g., color, textures, size, etc.), and iv) descriptive behaviors (e.g., placement, animation). The "review kits with buyer(s)" output may include capturing comments or changes.

The kit designer is responsible for create, read, update, and delete (CRUD) of kits in the kit repository and transforming structured information from sales into structural kit layout and content. The skill levels required for the kit designer are medium technical and good use of a limited tool set (e.g. limited options, more graphical than mathematical). The tools provided for the kit designer may include a Web, custom applications, and graphics/design tools, such as the Adobe Creative Suite (CS) and Adobe Acrobat 3D. The inputs associated with the kit designer include: i) structured requests from sales, ii) artifacts from sales, and iii) parts from part repository. The "structured requests from sales" input may include: i) descriptions of 3D objects, ii) behaviors/properties of 3D objects, and iii) artifacts from kit designer. The "artifacts from sales" input may include: i) 3D models, ii) 2D images, textures, logos, and iii) descriptions of part requirements. The outputs associated with the kit designer may include: i) kits into part repository, ii) requests to object builder for new/modified parts, and iii) customer models with descriptive behaviors that are needed. The "kits into part repository" output may include: i) kits (e.g., collections of parts with customized look and behaviors), ii) parts (e.g., 3D models), and iii) defined attributes for parts. These "defined attributes for parts" may include: i) imposed color, textures, size, etc., ii) placements relative to other parts, and iii) motions paths for (un)packing.

Figure 5:
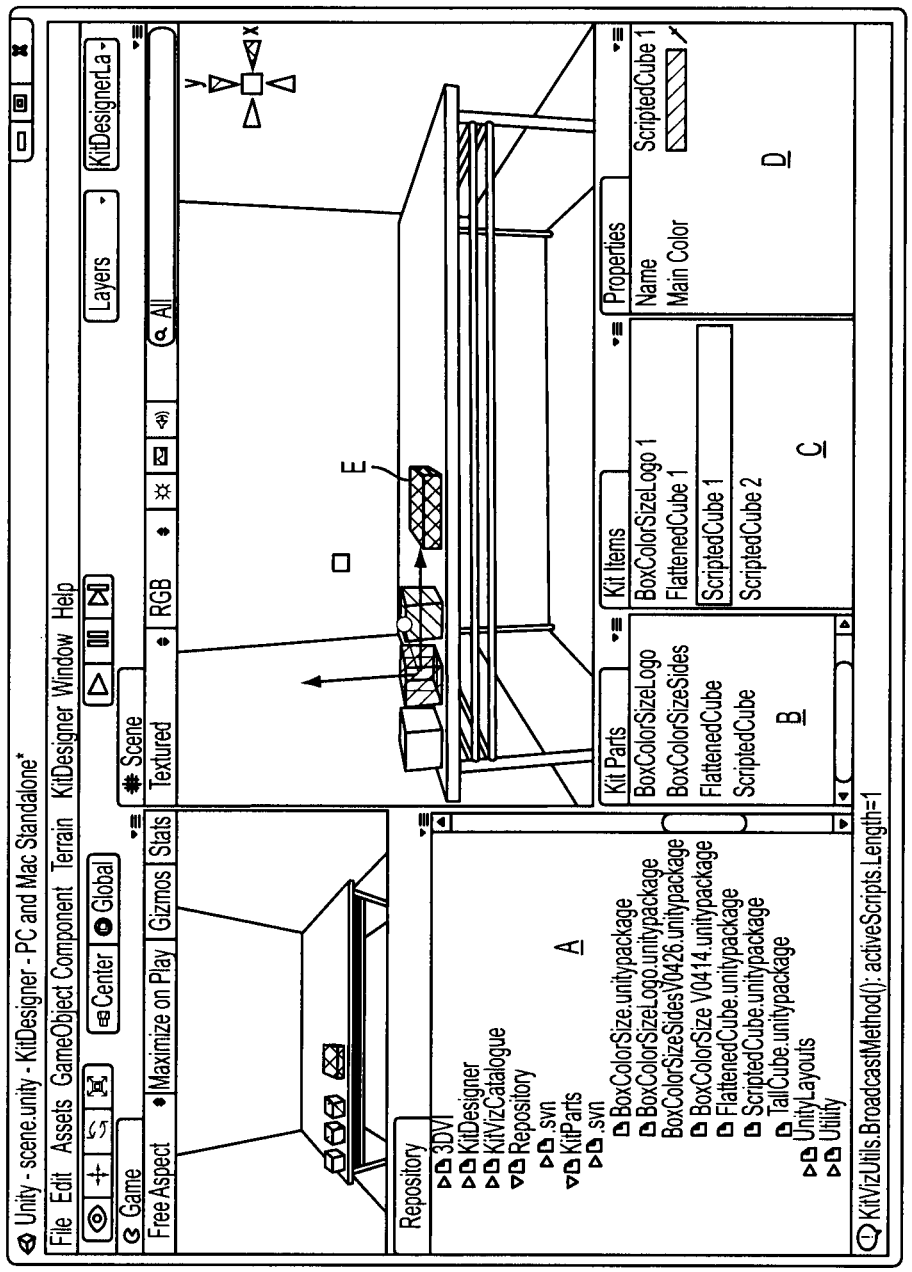
FIG. 5 is an exemplary display screen for managing an exemplary 3D virtual simulation in an exemplary embodiment of a kit fulfillment environment.
Figure 6:
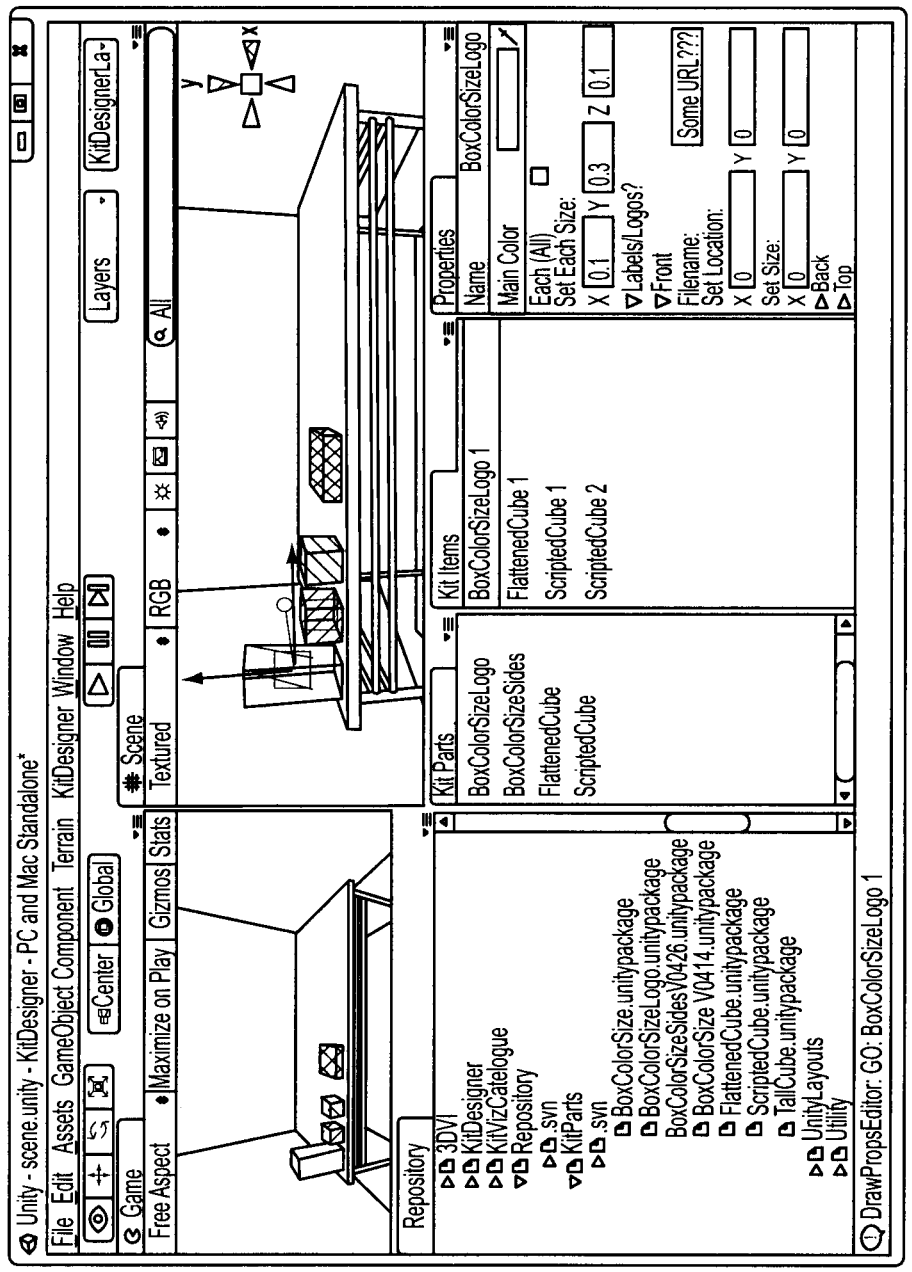
FIG. 6 is another exemplary display screen for managing another exemplary 3D virtual simulation in an exemplary embodiment of a kit fulfillment environment.

In several exemplary embodiments, the transformation of data from input to output is done using the processes encapsulated in FIGS. 5 and 6. For example, in FIG. 6, the Sales person would create entries in the KitViz Manifest describing a customer request such as: i) one mustard colored box (0.1×0.3×0.1) with the company logo on the front (see URL xyz for logo image file); ii) two cubes (each 0.1×0.1×0.1), one green and one magenta; iii) one red box (0.2×0.05×0.2); and iv) the tall mustard box should be placed in its side, next to (and behind) the two smaller boxes (placed side by side), the red box on top of all these, and then all shrink-wrapped together.

The Kit Designer will find the items in the catalogue or repository (FIG. 5, frame A) and add them to the list of "Kit Part" (FIG. 5, frame B). These items identify the 3D models required to build a virtual 3D rendering of the finished kit. In one embodiment, the 3D models are Unity3D ".packages" and scripts/programs to control its behaviors, and to customize any available attributes. The kit Design next "adds a part as an item," or creates an instance of the part for the kit. The list of these Kit items is shown in FIG. 5, frame C. This is done for each unique item in the kit, which is derived from items in the Kit Parts list. As an item is added, it will appear in the scene (FIG. 5, frame E) and be placed automatically according to a corresponding algorithm.

The Kit Designer "customizes" each Kit Item as defined by the sales request. In FIG. 5, it can be seen the selected cube is being assigned the color "green," and that is the only attribute (aside from "Name") which can be modified for this particular Kit Part. In FIG. 6, it can be seen that the Kit Designer is changing the color, size, and graphics contents of the selected Kit Item. Note the graphic content or "logo" is not reflected in this screen shot, as it was not yet integrated into this tool. This capability exists at the Object Builder tool level. Finally, the Kit Designer defines the relative spatial locations of all the Kit Items, as well as their motions for (dis)assembling the complete kit. The R-G-B arrows protruding from the selected objects in FIGS. 5 and 6 are a mechanism to drag and place the object in 3D-space. The Kit Designer would create motion paths to place the objects relative to one another.

The 3D virtual scene of all the Kit Items is viewable in FIG. 5, frame E. The Kit Designer has the ability to fly (e.g. zoom-pan-rotate) around the table top to inspect items from various angles. All the parameters for each object are saved by the Kit Designer into an updated version of the KitViz Manifest. The KitViz Manifest can then be opened again and edited, or used to create and instance usable by the sales person for review with the customer.

The object builder is responsible for CRUD of parts in the part repository. The skill levels required for the object builder are higher technical skills. The tools provided for the object builder may include graphics tools (e.g., Adobe CS, 3D design tools, code tools (e.g., software development tools), and tools for repository management. The inputs associated with the object builder include: i) requests from kit designer and ii) parts from part repository. The "requests from kit designer" input may include: i) descriptions of 3D objects, ii) behaviors/properties of 3D objects, iii) artifacts from kit designer, iv) 3D models, and v) 2D images, textures, logos. The outputs associated with the object builder include parts and scripts into part repository. The "parts and scripts into part repository" output may include: i) parts (e.g., 3D models) and ii) scripts to control parts. The "scripts to control parts" may include: i) properties (e.g., color, textures, size, etc.) and ii) behaviors (e.g., placement, animation).

Figure 3:
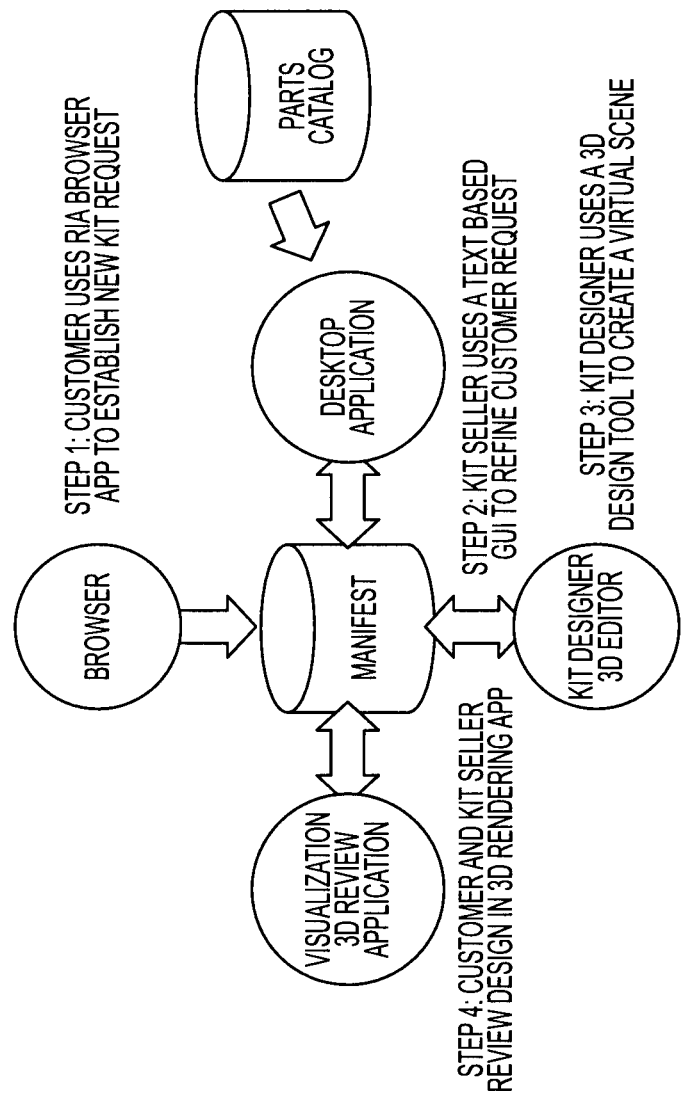
FIG. 3 is a functional diagram of an exemplary embodiment of a kit fulfillment environment for use in fulfillment of a kit.

With reference to FIG. 3, a functional diagram of an exemplary embodiment of a kit fulfillment environment for use in fulfillment of a kit includes a suite of applications that make use of various design tools and software libraries and the kit manifest to enable various work practices. The suite of applications may include a web browser rich internet application (RIA) (e.g., customer interface), a desktop application (e.g., sales tool), a kit designer application, and a kit review tool for rendering the 3D virtual simulation. Other business processes can be supported with applications that provide invoices, estimate shipping cost, etc.

The web browser RIA allows a customer to specify the original requirements and inputs to the kit fulfillment process. This could be similar to web portals used in document production managed services like Xerox Job Ticket (XJT). In another embodiment, the customer communicates with the sales agent, who in turn captures the requirements in the manifest.

Figure 4:
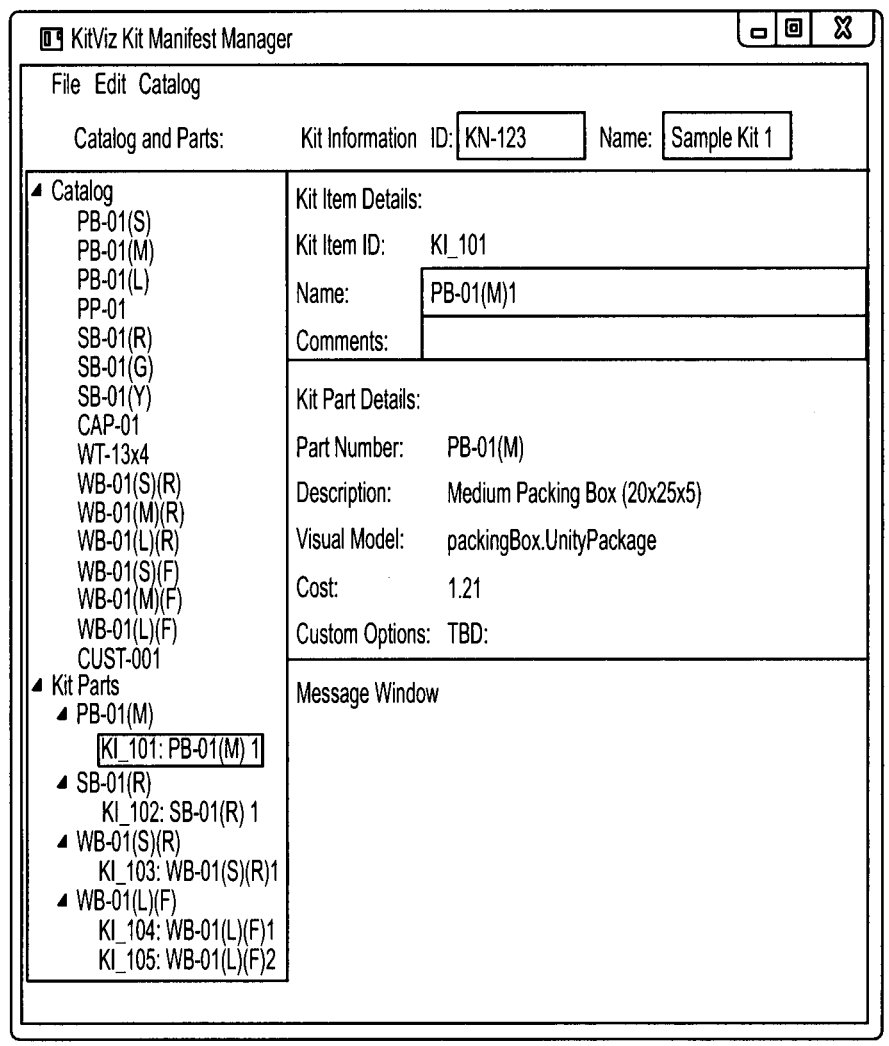
FIG. 4 is an exemplary display screen for managing an exemplary kit manifest in an exemplary embodiment of a kit fulfillment environment.

The desktop application may be used by the sales agent to assign kit provider parts (from their internal catalog) for each item required by the customer. This application enables the process of creating a format parts list and kit definition from an unstructured customer request. FIG. 4 shows such a tool in the current embodiment built with Microsoft WPF technology and using the current parts catalog and manifest support software.

Returning to FIG. 3, the Kit Designer application may include a 3D editor based, for example, in Unity 3D editor. This application allows the kit designer with technical expertise in kit design to define and assemble the kit and 3D visualization.

The kit review tool can be a multi-user 3D collaboration tool based, for example, on the 3D Unity Game engine with multi-user networking support. The tool allows the kit seller to demonstrate the current kit design to the customer. It also provides facilities for the customer to provide feedback and request changes. For example, objects may be tagged and comments applied during the demo.

Figure 13:
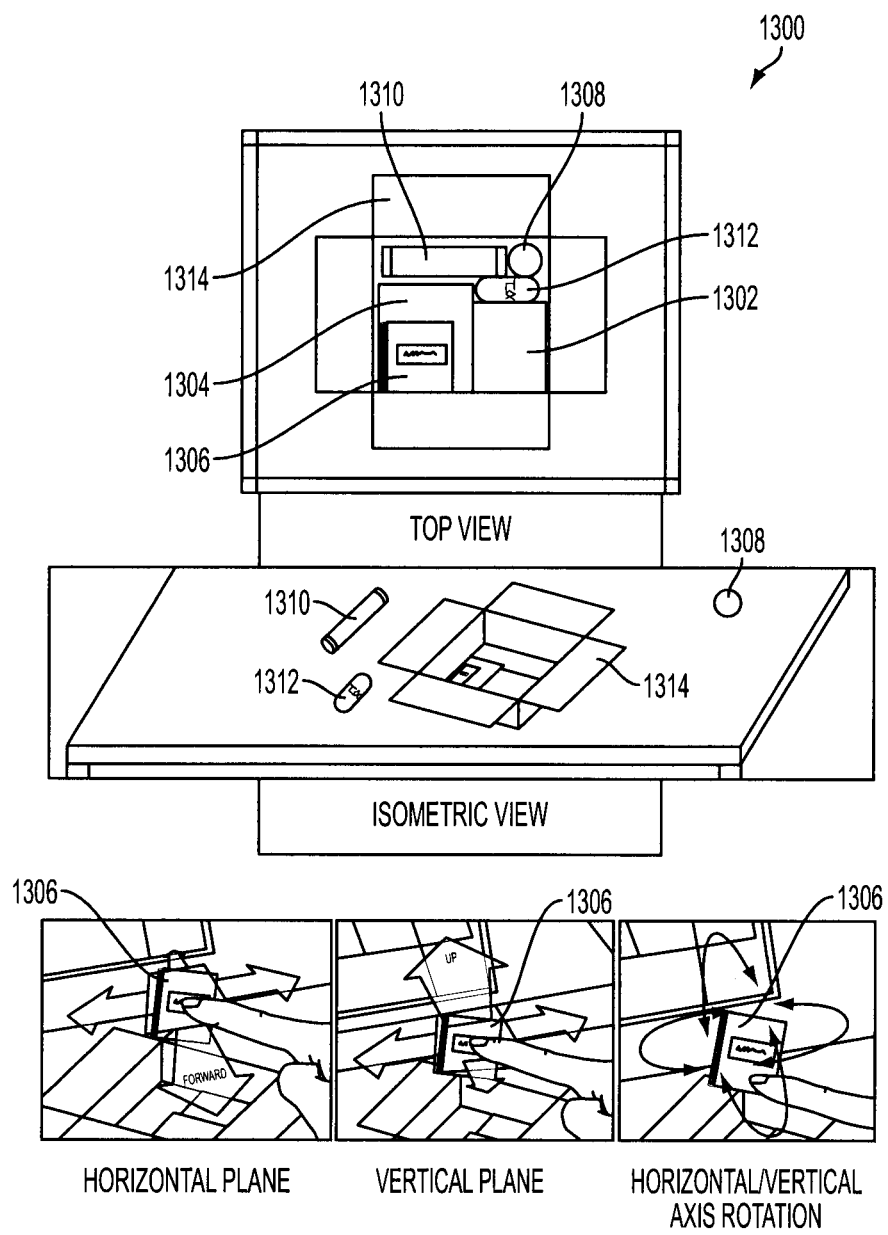
FIG. 13 is a set of diagrams that show a top view, perspective view, and exemplary object movement for an exemplary 3D simulation of an exemplary embodiment of a kit.

With reference to FIG. 13, an exemplary embodiment of a kit 1300 is shown in top and isometric views. The top view shows a colored box 1302, a wooden box 1304, a book 1306, a ball 1308, a tube 1310, and a capsule 1312 within a container 1314 to form a packed arrangement of the kit 1300. The kit and each item can be customized and location in spatial relation using various descriptive properties and descriptive behaviors.

Customization of the colored box 1302 can specify a green color and size dimensions. The colored box 1302 location can specify that it be placed in a lower right corner, at the bottom of the container 1314. The wooden box 1304 can be customized as brown wood grain and located in a lower left corner, at the bottom of the container 1314. Customization of the book 1306 can include use of red covers, size, spiral binding, selection of a logo, and placement of the logo on the front cover. The book 1306 location can specify that it be placed in the lower left corner of the container 1314, on top of the wooden box 1304. The ball 1308 can be customized in size and color and located in the upper right corner, at the bottom of the container 1314. Customization of the tube 1310 can specify its size, cardboard material, and white end caps.

The tube 1310 location can specify that it be placed along the upper edge, flush to the left side, at the bottom of the container 1314. The capsule 1312 can be customized in size, color, selection of a wrap-around logo, and placement of the logo around a mid-point of the capsule. The capsule 1312 location can specific that it be placed along the rear edge of the colored box 1302, on the bottom of the container 1314. Customization of the container 1314 can specify its size, color, and opening behavior (e.g., 4-flaps). The container 1314 can be specified as a root object, as a component of a higher level assembly, or as a individually-packaged component of a multi-component kit.

The isometric view shows the kit 1300 with the ball 1308, tube 1310, and capsule 1312 removed from the container 1314. The colored box 1302, wooden box 1304, and book 1306 remain in the container 1314 in this view.

An exemplary 3D simulation is also depicted in FIG. 13 in relation to the book 1306. The lower left view shows how the 3D simulation allows movement of the book 1306 in a horizontal plane. The lower middle view shows how the 3D simulation allows movement of the book 1306 in a vertical plane. The lower right view shows how the 3D simulation allows rotation of the book 1306 about horizontal and vertical axes.

Figure 7:
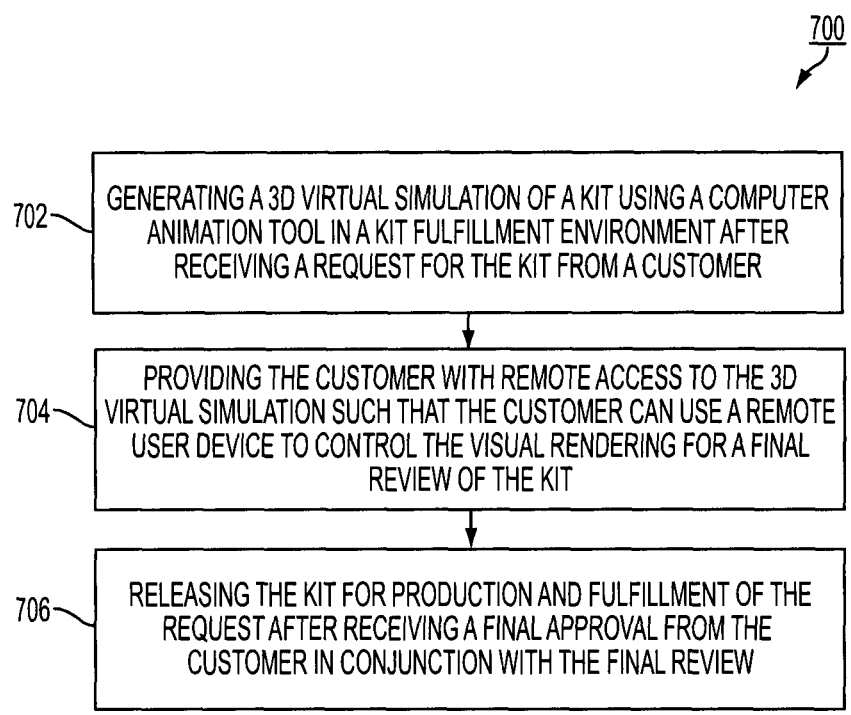
FIG. 7 is a flowchart of an exemplary embodiment of a process for fulfillment of a kit.

With reference to FIG. 7, an exemplary embodiment of a process 700 for fulfillment of a kit begins at 702 where a 3D virtual simulation of a kit is generated using a computer animation tool in a kit fulfillment environment after receiving a request for the kit from a customer. The kit fulfillment environment comprising at least one computer device and a kit repository storage device. The kit comprising a plurality of objects. The plurality of objects including a plurality of components and one or more receptacle. The 3D virtual simulation is formed using 3D virtual models of objects in the kit. The 3D virtual simulation reflects a select spatial layout of the components packed in the one or more receptacle. The 3D virtual simulation also includes an interactive animation that dynamically controls a visual rendering of the 3D virtual simulation in response to a user at a user device selectively manipulating the kit or at least one object. The 3D virtual simulation is stored in the kit repository storage device.

At 704, the customer is provided with remote access to the 3D virtual simulation such that the customer can use a remote user device to control the visual rendering for a final review of the kit. Next, the kit is released for production and fulfillment of the request after receiving a final approval from the customer in conjunction with the final review (706).

In another embodiment, the process 700 also includes transforming an unstructured description of the kit into a structured description after receiving the request for the kit. The unstructured description may include various descriptive properties and descriptive behaviors for the kit and objects within the kit, such as size, color, surface, logo selection and position, spatial relationships, and materials. The structured description includes a parts list identifying the kit and the plurality of objects. The 3D virtual simulation and the 3D virtual models are based at least in part on the structural description.

In yet another embodiment, the process 700 also includes transforming a structured description of the kit into a design specification using a kit design tool in the kit fulfillment environment after receiving the request for the kit. The design specification includes a parts list identifying the kit and the plurality of objects. The design specification also further defines the kit and objects using part numbers, descriptive properties, and descriptive behaviors, including the 3D virtual models. The design specification is stored in the kit repository storage device. The 3D virtual simulation is based at least in part on the design specification.

In still another embodiment of the process 700, descriptive properties and descriptive behaviors associated with objects are organized by part number and stored in part number records in a parts repository storage device accessible to the kit design tool. In this embodiment, first and second portions of the plurality of objects in the kit are identified. Each object in the first portion matches up to an existing part number record in the parts repository storage device. Each object in the second portion does not match up to an existing part number record. Next, a part number record is generated for each object of the second portion using an object design tool in the kit fulfillment environment. The kit fulfillment environment further comprising the parts repository storage device. Each part number record generated by the object design tool is based at least in part on one or more of the request for the kit, unstructured description, and structured description and includes the part number, descriptive properties, and descriptive behaviors of the corresponding object. Additionally, the parts repository storage device may include generic part records accessible to the object design tool to use as a source framework for the specific part number records that are generated for the objects in the second portion. The generic part records may include certain parameters with either blank or default values to which descriptive properties and descriptive behaviors from the kit request, unstructured description, or structured description can be added to form the specific part number record for the corresponding object.

In still yet another embodiment of the process 700, the customer is provided with remote access to a web server configured to permit the customer to use a browser on the remote user device to access the web server to submit the request for the kit that results in the generating in 702.

In another embodiment of the process 700, the 3D virtual simulation includes an animation of a select assembly procedure for the kit and an animation of a select unpacking procedure for the kit. The remote access provided in 704 permits the customer to control the assembly and unpacking procedure animations using the remote user device in conjunction with the final review.

In yet another embodiment of the process 700, the customer is provided with remote access to a web server configured to permit the customer to use a browser on the remote user device to access the web server to activate the 3D virtual simulation and control the visual rendering in conjunction with the final review. In a further embodiment of the process 700, the web server is configured to permit the customer to use the browser on the remote user device to request changes to the kit, submit comments on the kit, and provide final approval of the kit in conjunction with the final review.

Figure 8:
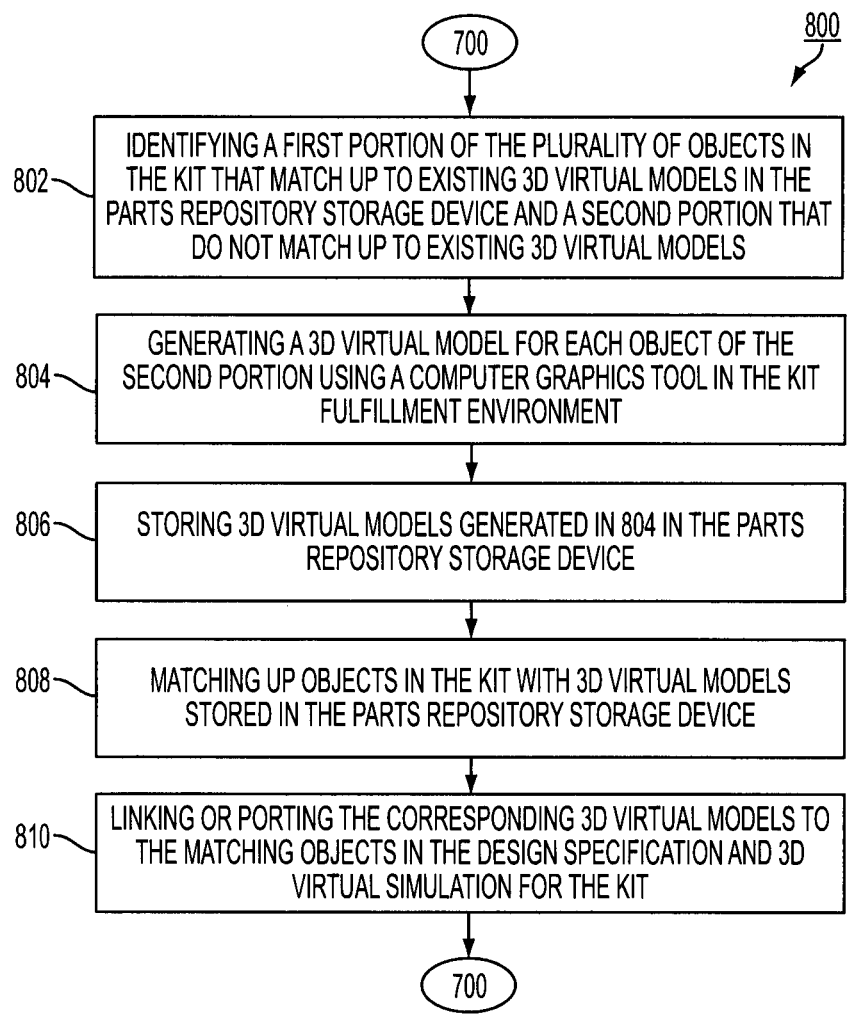
FIG. 8, in combination with FIG. 7, is a flowchart of another exemplary embodiment of a process for fulfillment of a kit.

With references to FIGS. 7 and 8, another exemplary embodiment of a process 800 for fulfillment of a kit includes the process 700 of FIG. 7 and continues at 802. In this embodiment, 3D virtual models associated with objects are stored in a parts repository storage device accessible to the computer animation tool. At 802, first and second portions of the plurality of objects in the kit are identified. Each object in the first portion matches up to an existing 3D virtual model in the parts repository storage device. Each object in the second portion does not match up to an existing 3D virtual model. Next, a 3D virtual model is generated for each object of the second portion using a computer graphics tool in the kit fulfillment environment (804). The kit fulfillment environment further comprising the parts repository storage device. Each 3D virtual model generated by the computer graphics tool is based at least in part on part numbers, descriptive properties, and descriptive behaviors of the corresponding object from one or more of the request for the kit, unstructured description, structured description, and part number record. Additionally, the parts repository storage device may include generic 3D virtual models accessible to the computer graphics tool to use as a source framework for the specific 3D virtual models that are generated for the objects in the second portion. The generic 3D virtual models may include certain parameters with either blank or default values to which descriptive properties and descriptive behaviors from the kit request, unstructured description, structured description, or part number record can be added to form the specific 3D virtual model for the corresponding object.

At 806, 3D virtual models generated in 804 are stored in the parts repository storage device. Next, objects in the kit are matched up with 3D virtual models stored in the parts repository storage device (808). At 810, the corresponding 3D virtual models are linked or ported to the matching objects in the design specification and 3D virtual simulation for the kit.

In another embodiment of the process 800, the kit design tool is adapted to process the parts list in conjunction with at least a portion of the identifying in 802 to use select information from the parts list to match up the first portion of the plurality of objects to 3D virtual models in the parts repository storage device.

In yet another embodiment of the process 800, the computer graphics tool is adapted to process the part numbers, descriptive properties, and descriptive behaviors in conjunction with at least a portion of the generating in 804 to use select information from the part numbers, descriptive properties, and descriptive behaviors to generate 3D virtual models for each object in the second portion of the plurality of objects.

Figure 9:
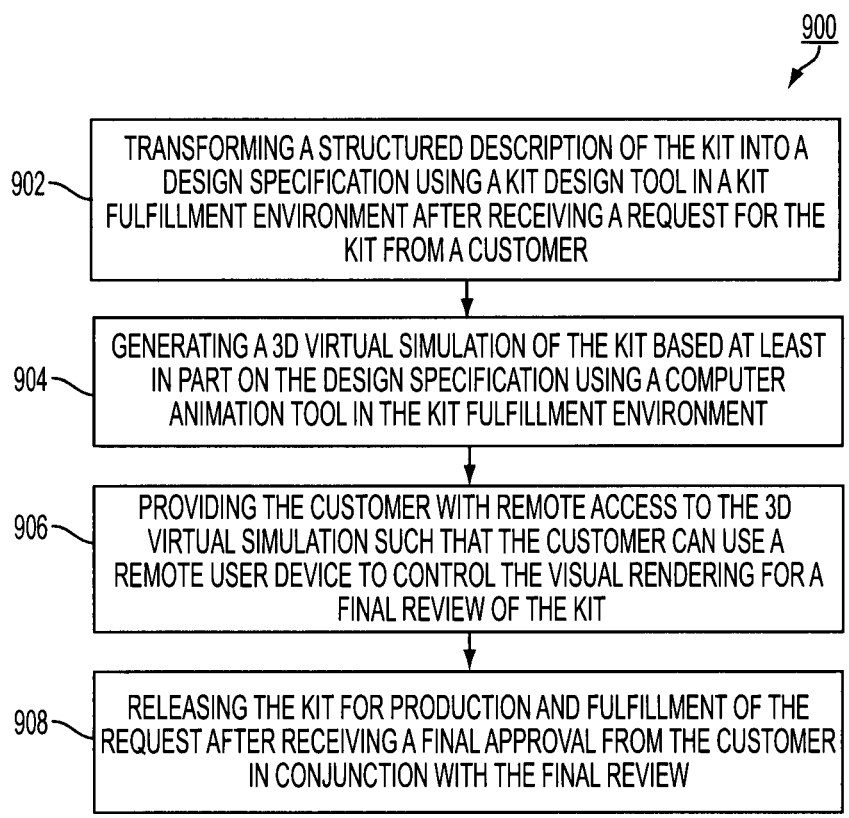
FIG. 9 is a flowchart of yet another exemplary embodiment of a process for fulfillment of a kit.

With reference to FIG. 9, yet another exemplary embodiment of a process 900 for fulfillment of a kit begins at 902 where a structured description of the kit is transformed into a design specification using a kit design tool in a kit fulfillment environment after receiving a request for the kit from a customer. The kit fulfillment environment comprising at least one computer device and a kit repository storage device. The kit comprising a plurality of objects. The plurality of objects including a plurality of components and one or more receptacle. The design specification including a parts list identifying the kit and the plurality of objects. The design specification also further defines the kit and objects using part numbers, descriptive properties, and descriptive behaviors, including 3D virtual models of objects in the kit. The design specification is stored in the kit repository storage device.

At 904, a 3D virtual simulation of the kit is generated based at least in part on the design specification using a computer animation tool in the kit fulfillment environment. The 3D virtual simulation is formed using the 3D virtual models of objects in the kit. The 3D virtual simulation reflects a select spatial layout of the components packed in the one or more receptacle. The 3D virtual simulation also includes an interactive animation that dynamically controls a visual rendering of the 3D virtual simulation in response to a user at a user device selectively manipulating the kit or at least one object. The 3D virtual simulation is stored in the kit repository storage device.

At 906, the customer is provided with remote access to the 3D virtual simulation such that the customer can use a remote user device to control the visual rendering for a final review of the kit. Next, the kit is released for production and fulfillment of the request after receiving a final approval from the customer in conjunction with the final review.

In another embodiment, the process 900 also includes transforming an unstructured description of the kit into the structured description after receiving the request for the kit. The unstructured description may also include various descriptive properties and descriptive behaviors for the kit and objects within the kit, such as size, color, surface, logo selection and position, spatial relationships, and materials. The structured description includes the parts list.

In yet another embodiment of the process 900, the customer is provided with remote access to a web server configured to permit the customer to use a browser on the remote user device to access the web server to submit the request for the kit that results in the transforming in 902. In still another embodiment of the process 900, the kit design tool is adapted to process the structured description in conjunction with at least a portion of the transforming in 902 to form the design specification.

In still yet another embodiment, the process 900 also includes providing the customer with remote access to the design specification such that the customer can use the remote user device for an intermediate review of the kit. The generating in 904 is after receiving an intermediate approval from the customer in conjunction with the intermediate review. In a further embodiment of the process 900, the customer is provided with remote access to a web server configured to permit the customer to use a browser on the remote user device to access the web server to view the design specification, including the 3D virtual models of objects in the kit, in conjunction with the intermediate review. In an even further embodiment of the process 900, the web server is configured to permit the customer to use the browser on the remote user device to request changes to the kit, submit comments on the kit, and provide intermediate approval of the kit in conjunction with the intermediate review.

In another embodiment of the process 900, 3D virtual models associated with objects are stored in a parts repository storage device accessible to the kit design tool and computer animation tool. In this embodiment, first and second portions of the plurality of objects in the kit are identified. Each object in the first portion matches up to an existing 3D virtual model in the parts repository storage device. Each object in the second portion does not match up to an existing 3D virtual model. Next, a 3D virtual model is generated for each object of the second portion using a computer graphics tool in the kit fulfillment environment. The kit fulfillment environment further comprising the parts repository storage device. Each 3D virtual model generated by the computer graphics tool is based at least in part on part numbers, descriptive properties, and descriptive behaviors of the corresponding object from one or more of the request for the kit, unstructured description, structured description, and part number record. Additionally, the parts repository storage device may include generic 3D virtual models accessible to the computer graphics tool to use as a source framework for the specific 3D virtual models that are generated for the objects in the second portion. The generic 3D virtual models may include certain parameters with either blank or default values to which descriptive properties and descriptive behaviors from the kit request, unstructured description, structured description, or part number record can be added to form the specific 3D virtual model for the corresponding object.

In yet another embodiment of the process 900, the computer animation tool is adapted to process the design specification in conjunction with at least a portion of the generating in 904 to form the 3D virtual simulation.

Figure 10:
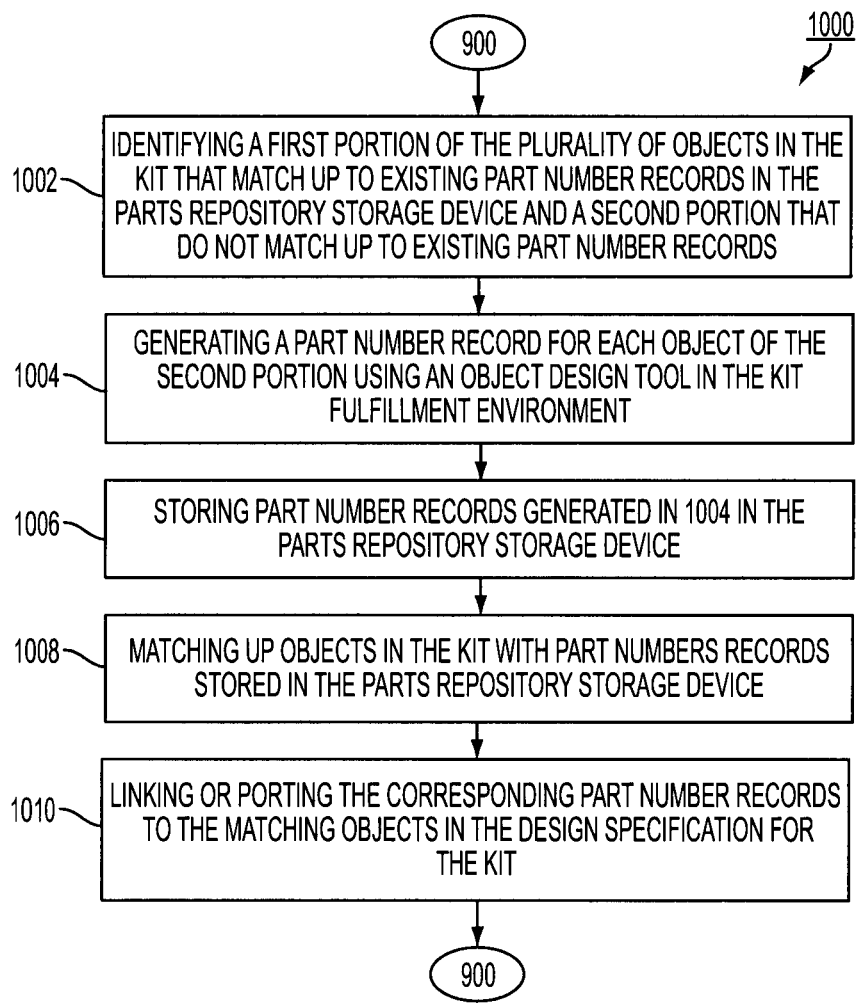
FIG. 10, in combination with FIG. 9, is a flowchart of still another exemplary embodiment of a process for fulfillment of a kit.

With reference to FIGS. 9 and 10, still another exemplary embodiment of a process 1000 for fulfillment of a kit includes the process 900 of FIG. 9 and continues at 1002. In this embodiment, descriptive properties and descriptive behaviors associated with objects are organized by part number and stored in part number records in a parts repository storage device accessible to the kit design tool. At 1002, first and second portions of the plurality of objects in the kit are identified. Each object in the first portion matches up to an existing part number record in the parts repository storage device. Each object in the second portion does not match up to an existing part number record. Next, a part number record is generated for each object of the second portion using an object design tool in the kit fulfillment environment (1004). The kit fulfillment environment further comprising the parts repository storage device. Each part number record generated by the object design tool is based at least in part on one or more of the request for the kit, unstructured description, and structured description and includes the part number, descriptive properties, and descriptive behaviors of the corresponding object. Additionally, the parts repository storage device may include generic part records accessible to the object design tool to use as a source framework for the specific part number records that are generated for the objects in the second portion. The generic part records may include certain parameters with either blank or default values to which descriptive properties and descriptive behaviors from the kit request, unstructured description, or structured description can be added to form the specific part number record for the corresponding object.

At 1006, part number records generated in 1004 are stored in the parts repository storage device. Next, objects in the kit are matched up with part number records stored in the parts repository storage device (1008). At 1010, the corresponding part number records are linked or ported to the matching objects in the design specification for the kit.

In another embodiment of the process 1000, the kit design tool is adapted to process the parts lists in conjunction with at least a portion of the identifying in 1002 to use select information from the parts list to match up the first portion of the plurality of objects to part number records in the parts repository storage device.

In yet another embodiment of the process 1000, the object design tool is adapted to process the parts list in conjunction with at least a portion of the generating in 1004 to use select information from the parts list to generate part number records for each object in the second portion of the plurality of objects.

Figure 11:
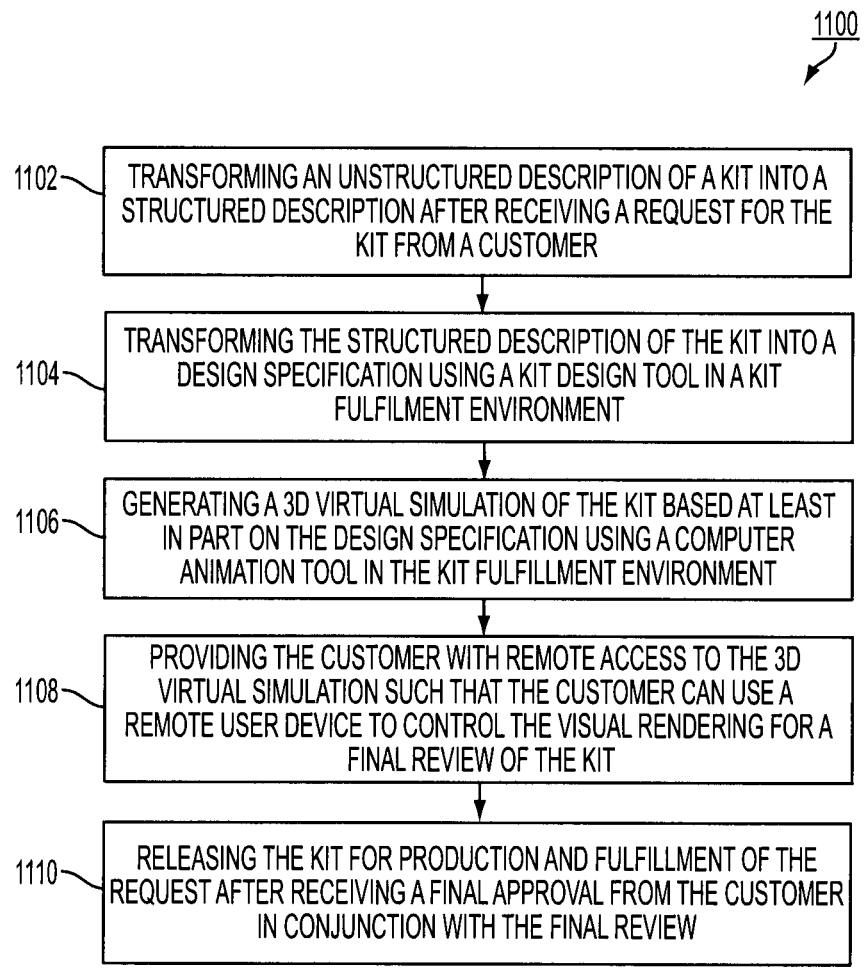
FIG. 11 is a flowchart of still yet another exemplary embodiment of a process for fulfillment of a kit.

With reference to FIG. 11, still yet another exemplary embodiment of a process 1100 for fulfillment of a kit begins at 1102 where an unstructured description of a kit is transformed into a structured description after receiving a request for the kit from a customer. The kit comprising a plurality of objects. The plurality of objects including a plurality of components and one or more receptacle. The structured description includes a parts list identifying the kit and the plurality of objects.

At 1104, the structured description of the kit is transformed into a design specification using a kit design tool in a kit fulfillment environment. The kit fulfillment environment comprising at least one computer device and a kit repository storage device. The design specification includes the parts list. The design specification also further defines the kit and objects using part numbers, descriptive properties, and descriptive behaviors, including 3D virtual models of objects in the kit. The design specification is stored in the kit repository storage device.

At 1106, a 3D virtual simulation of the kit is generated based at least in part on the design specification using a computer animation tool in the kit fulfillment environment. The 3D virtual simulation is formed using the 3D virtual models of objects in the kit. The 3D virtual simulation reflects a select spatial layout of the plurality of components packed in the one or more receptacle. The 3D virtual simulation also includes an interactive animation that dynamically controls a visual rendering of the 3D virtual simulation in response to a user at a user device selectively manipulating the kit or at least one object. The 3D virtual simulation is stored in the kit repository storage device.

At 1108, the customer is provided with remote access to the 3D virtual simulation such that the customer can use a remote user device to control the visual rendering for a final review of the kit. Next, the kit is released for production and fulfillment of the request after receiving a final approval from the customer in conjunction with the final review (1110).

In another embodiment of the process 1100, the unstructured description includes desired objects for the kit, desired properties for the kit and objects, and desired behaviors for the kit and objects. In still another embodiment of the process 1100, the request for the kit received from the customer includes the unstructured description. The kit request may also include various descriptive properties and descriptive behaviors for the kit and objects within the kit, such as size, color, surface, logo selection and position, spatial relationships, and materials. In yet another embodiment of the process 1100, the customer is provided with remote access to a web server configured to permit the customer to use a browser on the remote user device to access the web server to submit the request for the kit that results in the transforming in 1102.

In still yet another embodiment of the process 1100, a computer sales tool in the kit fulfillment environment is used in conjunction with the transforming in 1102. In a further embodiment of the process 1100, the computer sales tool is adapted to process the unstructured description in conjunction with at least a portion of the transforming in 1102 to form the structured description.

In another further embodiment of the process 1100, the structured description is stored in the kit repository storage device. In this embodiment, the process 1100 also includes providing the customer with remote access to the structured description such that the customer can use the remote user device for a preliminary review of the kit. In the embodiment being described, the transforming in 1104 is after receiving a preliminary approval from the customer in conjunction with the preliminary review. In a yet further embodiment of the process 1100, the customer is provided with remote access to a web server configured to permit the customer to use a browser on the remote user device to access the web server to view the structured description in conjunction with the preliminary review. In an even further embodiment of the process 1100, the web server is configured to permit the customer to use the browser on the remote user device to request changes to the kit, submit comments on the kit, and provide preliminary approval of the kit in conjunction with the preliminary review.

In the various embodiments of methods for fulfillment of a kit and kit development environments described herein, the at least one computer device may include various arrangements of computer devices for various types of users (e.g., sales representative, kit designer, object builder, etc.). The design tools (e.g., computer animation tool) can all be installed on one or more computer device or distributed among multiple computer devices in any combination. For example, a user computer for a sales representative may have different design tools than a user computer for a kit designer or an object builder. A client-server tool may have a client portion operating on a user computer device and a server portion operating on a server. Other tools may be fully operational on a user computer and networked to servers that store various kit development information, such as part number records, 3D virtual models, the structured description, design specification, and 3D virtual simulation.

Figure 12:
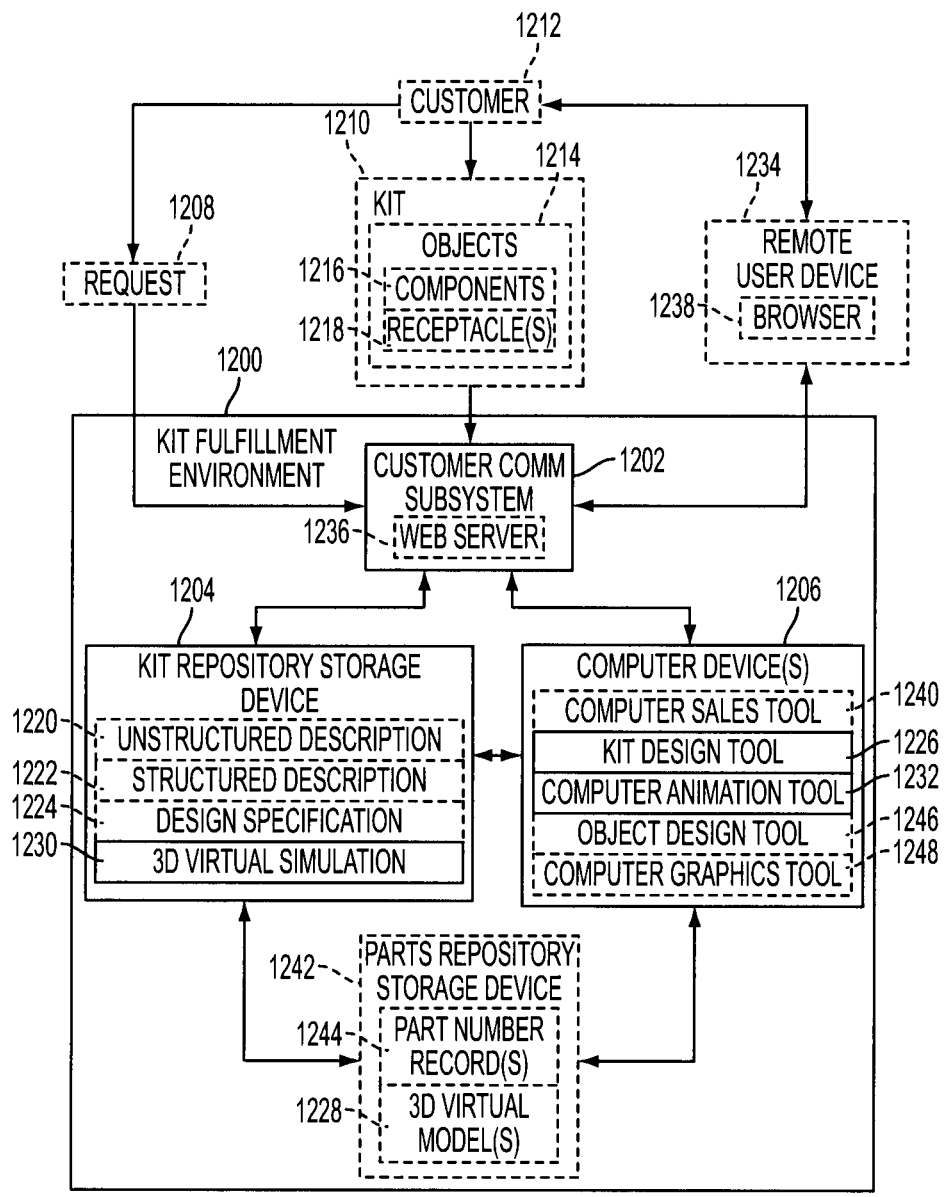
FIG. 12 is a block diagram of an exemplary embodiment of a kit fulfillment environment for use in fulfillment of a kit.

With reference to FIG. 12, an exemplary embodiment of a kit fulfillment environment 1200 for use in fulfillment of a kit includes a customer communication subsystem 1202, a kit repository storage device 1204, and at least one computer device 1206. The customer communication subsystem 1202 for receiving a request 1208 for a kit 1210 from a customer 1212. The kit 1210 comprising a plurality of objects 1214. The plurality of objects 1214 including a plurality of components 1216 and one or more receptacle 1218.

The at least one computer device 1206 in operative communication with the customer communication subsystem 1202 and kit repository storage device 1204 for use in conjunction with transforming an unstructured description 1220 of the kit 1210 into a structured description 1222 in response to the customer communication subsystem 1202 receiving the request 1208 for the kit 1210. The unstructured description may also include various descriptive properties and descriptive behaviors for the kit and objects within the kit, such as size, color, surface, logo selection and position, spatial relationships, and materials. The structured description 1220 includes a parts list identifying the kit 1210 and the plurality of objects 1214.

The at least one computer device 1206 also for use in conjunction with transforming the structured description 1222 of the kit 1210 into a design specification 1224 using a kit design tool 1226. The design specification 1224 includes the parts list and further defines the kit 1210 and objects 1214 using part numbers, descriptive properties, and descriptive behaviors, including 3D virtual models 1228 of objects 1214 in the kit 1210. The design specification 1224 is stored in the kit repository storage device 1204.

Additionally, the at least one computer device 1206 is for use in conjunction with generating a 3D virtual simulation 1230 of the kit 1210 based at least in part on the design specification 1224 using a computer animation tool 1232. The 3D virtual simulation 1230 is formed using the 3D virtual models 1228 of objects 1214 in the kit 1210. The 3D virtual simulation 1230 reflects a select spatial layout of the plurality of components 1216 packed in the one or more receptacle 1218. The 3D virtual simulation 1230 also includes an interactive animation that dynamically controls a visual rendering of the 3D virtual simulation 1230 in response to a user at a user device selectively manipulating the kit 1210 or at least one object 1214. The 3D virtual simulation 1230 is stored in the kit repository storage device 1204.

The customer 1212 is provided with remote access to the 3D virtual simulation 1230 via the customer communication subsystem 1202 such that the customer 1212 can use a remote user device 1234 to control the visual rendering for a final review of the kit 1210. The kit 1210 is released for production and fulfillment of the request 1208 after receiving a final approval from the customer 1212 via the customer communication subsystem 1202 in conjunction with the final review.

In another embodiment of the kit fulfillment environment 1200, the unstructured description 1220 includes desired objects for the kit 1210, desired properties for the kit 1210 and objects 1214, and desired behaviors for the kit 1210 and objects 1214. In still another embodiment of the kit fulfillment environment 1200, the request 1208 for the kit 1210 received from the customer 1212 via the customer communication subsystem 1202 includes the unstructured description 1220. The kit request may also include various descriptive properties and descriptive behaviors for the kit and objects within the kit, such as size, color, surface, logo selection and position, spatial relationships, and materials.

In yet another embodiment of the kit fulfillment environment 1200, the customer communication subsystem 1202 comprises a web server 1236 to which the customer 1212 is provided remote access. The web server 1236 is configured to permit the customer 1212 to use a browser 1238 on the remote user device 1234 to access the web server 1236 to submit the request 1208 for the kit 1210 that results in the transforming of the unstructured description 1220.

In still yet another embodiment of the kit fulfillment environment 1200, a computer sales tool 1240 in the at least one computer device 1206 is used in conjunction with the transforming of the unstructured description 1220. In a further embodiment of the kit fulfillment environment 1200, the computer sales tool 1240 is adapted to process the unstructured description 1220 in conjunction with at least a portion of the transforming of the unstructured description 1220 to form the structured description 1222.

In another further embodiment of the kit fulfillment environment 1200, the structured description 1222 is stored in the kit repository storage device 1204. The customer 1212 is provided with remote access to the structured description 1222 such that the customer 1212 can use the remote user device 1234 for a preliminary review of the kit 1210. In this embodiment, the transforming of the structured description 1222 is after receiving a preliminary approval from the customer 1212 in conjunction with the preliminary review.

In a still further embodiment of the kit fulfillment environment 1200, the customer communication subsystem 1202 comprises a web server 1236 to which the customer 1212 is provided with remote access. The web server 1236 is configured to permit the customer 1212 to use a browser 1238 on the remote user device 1234 to access the web server 1236 to view the structured description 1222 in conjunction with the preliminary review. In an even further embodiment of the kit fulfillment environment 1200, the web server 1236 is configured to permit the customer 1212 to use the browser 1238 on the remote user device 1234 to request changes to the kit 1210, submit comments on the kit 1210, and provide preliminary approval of the kit 1210 in conjunction with the preliminary review.

In another embodiment of the kit fulfillment environment 1200, the kit design tool 1226 is adapted to process the structured description 1222 in conjunction with at least a portion of the transforming of the structured description 1222 to form the design specification 1224.

In yet another embodiment of the kit fulfillment environment 1200, the customer 1212 is provided with remote access to the design specification 1224 such that the customer 1212 can use the remote user device 1234 for an intermediate review of the kit 1210. In this embodiment, the generating of the 3D virtual simulation 1230 is after receiving an intermediate approval from the customer 1212 in conjunction with the intermediate review. In a further embodiment of the kit fulfillment environment 1200, the customer communication subsystem 1202 comprises a web server 1236 to which the customer 1212 is provided with remote access. The web server 1236 is configured to permit the customer 1212 to use a browser 1238 on the remote user device 1234 to access the web server 1236 to view the design specification 1224, including the 3D virtual models 1228 of objects 1214 in the kit 1210, in conjunction with the intermediate review. In still further embodiment of the kit fulfillment environment 1200, the web server 1236 is configured to permit the customer 1212 to use the browser 1238 on the remote user device 1234 to request changes to the kit 1210, submit comments on the kit 1210, and provide intermediate approval of the kit 1210 in conjunction with the intermediate review.

In still another embodiment, the kit fulfillment environment 1200 also includes a parts repository storage device 1242 in which descriptive properties and descriptive behaviors associated with objects 1214 are organized by part number and stored in part number records 1244 accessible to the kit design tool 1226. In this embodiment, the at least one computer device 1206 is also in operative communication with the parts repository storage device 1242 for use in conjunction with identifying a first portion of the plurality of objects 1214 in the kit 1210 that match up to existing part number records 1244 in the parts repository storage device 1242 and a second portion that do not match up to existing part number records 1244. In the embodiment being described, the at least one computer device 1206 is also for use in conjunction with generating a part number record 1244 for each object 1214 of the second portion of the plurality of objects 1214 using an object design tool 1246. Each part number record 1244 generated by the object design tool 1246 is based at least in part on one or more of the request for the kit, unstructured description, and structured description and includes the part number, descriptive properties, and descriptive behaviors of the corresponding object. Additionally, the parts repository storage device may include generic part records accessible to the object design tool to use as a source framework for the specific part number records that are generated for the objects in the second portion. The generic part records may include certain parameters with either blank or default values to which descriptive properties and descriptive behaviors from the kit request, unstructured description, or structured description can be added to form the specific part number record for the corresponding object.

In a further embodiment of the kit fulfillment environment 1200, the kit design tool 1226 is adapted to process the parts list in conjunction with at least a portion of the identifying of the first portion to use select information from the parts list to match up the first portion of the plurality of objects 1214 to part number records 1244 in the parts repository storage device 1242. In another further embodiment of the kit fulfillment environment 1200, the object design tool 1246 is adapted to process the parts list in conjunction with at least a portion of the generating of the part number records 1244 to use select information from the parts list to generate part number records 1244 for each object 1214 in the second portion of the plurality of objects 1214.

In yet another further embodiment of the kit fulfillment environment 1200, the part number records 1244 generated for the second portion of the plurality of objects 1214 are stored in the parts repository storage device 1242. In this embodiment, the at least one computer device 1206 is for use in conjunction with matching up objects 1214 in the kit with part number records 1244 stored in the parts repository storage device 1242 and linking or porting the corresponding part number records 1244 to the matching objects 1214 in the design specification 1224 for the kit 1210.

In still yet another embodiment, the kit fulfillment environment 1200 also includes a parts repository storage device 1242 in which 3D virtual models 1228 associated with objects 1214 are stored and accessible to the kit design tool 1226 and computer animation tool 1232. In this embodiment, the at least one computer device 1206 is also in operative communication with the parts repository storage device 1242 for use in conjunction with identifying a first portion of the plurality of objects 1214 in the kit 1210 that match up to existing 3D virtual models 1228 in the parts repository storage device 1242 and a second portion that do not match up to existing 3D virtual models 1228. In the embodiment being described, the at least one computer device 1206 is also for use in conjunction with generating a 3D virtual model 1228 for each object 1214 of the second portion of the plurality of objects 1214 using a computer graphics tool 1248. Each 3D virtual model 1228 generated by the computer graphics tool 1248 is based at least in part on part numbers, descriptive properties, and descriptive behaviors of the corresponding object from one or more of the request for the kit, unstructured description, structured description, and part number record. Additionally, the parts repository storage device may include generic 3D virtual models accessible to the computer graphics tool to use as a source framework for the specific 3D virtual models that are generated for the objects in the second portion. The generic 3D virtual models may include certain parameters with either blank or default values to which descriptive properties and descriptive behaviors from the kit request, unstructured description, structured description, or part number record can be added to form the specific 3D virtual model for the corresponding object.

In a further embodiment of the kit fulfillment environment 1200, the kit design tool 1226 is adapted to process the parts list in conjunction with at least a portion of the identifying of the first portion to use select information from the parts list to match up the first portion of the plurality of objects 1214 to 3D virtual models 1228 in the parts repository storage device 1242. In another further embodiment of the kit fulfillment environment 1200, the computer graphics tool 1248 is adapted to process the part numbers, descriptive properties, and descriptive behaviors in conjunction with at least a portion of the generating of the 3D virtual models 1228 to use select information from the part numbers, descriptive properties, and descriptive behaviors to generate 3D virtual models 1228 for each object 1214 in the second portion of the plurality of objects 1214.

In yet another further embodiment of the kit fulfillment environment 1200, 3D virtual models 1228 generated for the second portion of the plurality of objects 1214 are stored in the parts repository storage device 1242. In this embodiment, the at least one computer device 1206 is also for use in conjunction with matching up objects 1214 in the kit 1210 with 3D virtual models 1228 stored in the parts repository storage device 1242 and linking or porting the corresponding 3D virtual models 1228 to the matching objects 1214 in the design specification 1224 and 3D virtual simulation 1230 for the kit 1210.

In another embodiment of the kit fulfillment environment 1200, the computer animation tool 1232 is adapted to process the design specification 1224 in conjunction with at least a portion of the generating of the 3D virtual simulation 1230. In yet another embodiment of the kit fulfillment environment 1200, the 3D virtual simulation 1230 includes an animation of a select assembly procedure for the kit 1210 and an animation of a select unpacking procedure for the kit 1210. In this embodiment, the remote access provided via the customer communication subsystem 1202 permits the customer 1212 to control the assembly and unpacking procedure animations using the remote user device 1234 in conjunction with the final review.

In still another embodiment of the kit fulfillment environment 1200, the customer communication subsystem 1202 comprises a web server 1236 to which the customer 1212 is provided with remote access. In this embodiment, the web server 1236 is configured to permit the customer 1212 to use a browser 1238 on the remote user device 1234 to access the web server 1236 to activate the 3D virtual simulation 1230 and control the visual rendering in conjunction with the final review. In a further embodiment of the kit fulfillment environment 1200, the web server 1236 is configured to permit the customer 1212 to use the browser 1238 on the remote user device 1234 to request changes to the kit, submit comments on the kit, and provide final approval of the kit in conjunction with the final review.

Yet another exemplary embodiment of a process for fulfillment of a kit is performed by a computer in a computer-controlled device executing program instructions stored on a non-transitory computer-readable medium. In various embodiments, the program instructions stored in the non-transitory computer-readable memory, when executed by the computer, may cause the computer-controlled device to perform various combinations of functions associated with the various embodiments of the processes 700, 800, 900, 1000, 1100 for fulfillment of a kit described above with reference to FIGS. 7-11. In other words, the various embodiments of the processes 700, 800, 900, 1000, 1100 for fulfillment of a kit described above may also be implemented by corresponding embodiments of a process associated with the program instructions stored in the non-transitory computer-readable memory.

Likewise, in various embodiments, the program instructions stored in the non-transitory computer-readable memory, when executed by the computer, may cause the computer-controlled device to perform various combinations of functions associated with the various embodiments of the kit fulfillment environment 1200 for use in fulfillment of a kit described above with reference to FIG. 12. In other words, the functions associated with the various embodiments of the kit fulfillment environment 1200 described above may also be implemented by corresponding embodiments of a process associated with the program instructions stored in the non-transitory computer-readable memory.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method for fulfillment of a kit, comprising:
   a) transforming an unstructured description of a kit into a structured description after receiving a request for the kit from a customer, wherein the kit comprises a plurality of objects which include a plurality of components and one or more receptacle, wherein the structured description includes a parts list identifying the kit and the plurality of objects;
   b) transforming the structured description of the kit into a design specification using a kit design tool in a kit fulfillment environment, the kit fulfillment environment comprising at least one computer device and a kit repository storage device, wherein the design specification includes the parts list and further defines the kit and objects using part numbers, descriptive properties, and descriptive behaviors, including 3D virtual models of objects in the kit, wherein the design specification is stored in the kit repository storage device;
   c) generating a 3D virtual simulation of the kit based at least in part on the design specification using a computer animation tool in the kit fulfillment environment, wherein the 3D virtual simulation is formed using the 3D virtual models of objects in the kit, wherein the 3D virtual simulation reflects a select spatial layout of the plurality of components packed in the one or more receptacle and includes an interactive animation that dynamically controls a visual rendering of the 3D virtual simulation in response to a user at a user device selectively manipulating the kit or at least one object, wherein the 3D virtual simulation is stored in the kit repository storage device;
   d) providing the customer with remote access to the 3D virtual simulation such that the customer can use a remote user device to control the visual rendering for a final review of the kit; and
   e) releasing the kit for production and fulfillment of the request after receiving a final approval from the customer in conjunction with the final review.

2. The method of claim 1 wherein a computer sales tool in the kit fulfillment environment is used in conjunction with the transforming in a).

3. The method of claim 2 wherein the computer sales tool is adapted to process the unstructured description in conjunction with at least a portion of the transforming in a) to form the structured description.

4. The method of claim 2 wherein the structured description is stored in the kit repository storage device, the method further comprising:
   f) providing the customer with remote access to the structured description such that the customer can use the remote user device for a preliminary review of the kit, wherein the transforming in b) is after receiving a preliminary approval from the customer in conjunction with the preliminary review.

5. The method of claim 1 wherein the kit design tool is adapted to process the structured description in conjunction with at least a portion of the transforming in b) to form the design specification.

6. The method of claim 1, further comprising:
   f) providing the customer with remote access to the design specification such that the customer can use the remote user device for an intermediate review of the kit, wherein the generating in c) is after receiving an intermediate approval from the customer in conjunction with the intermediate review.

7. The method of claim 1 wherein descriptive properties and descriptive behaviors associated with objects are organized by part number and stored in part number records in a parts repository storage device accessible to the kit design tool, the method further comprising:
   f) identifying a first portion of the plurality of objects in the kit that match up to existing part number records in the parts repository storage device and a second portion that do not match up to existing part number records; and
   g) generating a part number record for each object of the second portion using an object design tool in the kit fulfillment environment, the kit fulfillment environment further comprising the parts repository storage device, wherein each part number record generated by the object design tool is based at least in part on one or more of the request for the kit, unstructured description, and structured description and includes the part number, descriptive properties, and descriptive behaviors of the corresponding object.

8. The method of claim 1 wherein 3D virtual models associated with objects are stored in a parts repository storage device accessible to the kit design tool and computer animation tool, the method further comprising:
   f) identifying a first portion of the plurality of objects in the kit that match up to existing 3D virtual models in the parts repository storage device and a second portion that do not match up to existing 3D virtual models; and
   g) generating a 3D virtual model for each object of the second portion using a computer graphics tool in the kit fulfillment environment, the kit fulfillment environment further comprising the parts repository storage device, wherein each 3D virtual model generated by the computer graphics tool is based at least in part on part numbers, descriptive properties, and descriptive behaviors of the corresponding object from one or more of the request for the kit, unstructured description, structured description, and part number record.

9. The method of claim 1 wherein the computer animation tool is adapted to process the design specification in conjunction with at least a portion of the generating in b) to form the 3D virtual simulation.

10. A method for fulfillment of a kit, comprising:
   a) generating a 3D virtual simulation of a kit using a computer animation tool in a kit fulfillment environment after receiving a request for the kit from a customer, the kit fulfillment environment comprising at least one computer device and a kit repository storage device, wherein the kit comprises a plurality of objects which include a plurality of components and one or more receptacle, wherein the 3D virtual simulation is formed using 3D virtual models of objects in the kit, wherein the 3D virtual simulation reflects a select spatial layout of the components packed in the one or more receptacle and includes an interactive animation that dynamically controls a visual rendering of the 3D virtual simulation in response to a user at a user device selectively manipulating the kit or at least one object, wherein the 3D virtual simulation is stored in the kit repository storage device;
   b) providing the customer with remote access to the 3D virtual simulation such that the customer can use a remote user device to control the visual rendering for a final review of the kit; and
   c) releasing the kit for production and fulfillment of the request after receiving a final approval from the customer in conjunction with the final review.

11. The method of claim 10, further comprising:
   d) transforming an unstructured description of the kit into a structured description after receiving the request for the kit, wherein the structured description includes a parts list identifying the kit and the plurality of objects, wherein the 3D virtual simulation and the 3D virtual models are based at least in part on the structural description.

12. The method of claim 10, further comprising:
   d) transforming a structured description of the kit into a design specification using a kit design tool in the kit fulfillment environment after receiving the request for the kit, wherein the design specification includes a parts list identifying the kit and the plurality of objects and further defines the kit and objects using part numbers, descriptive properties, and descriptive behaviors, including the 3D virtual models, wherein the design specification is stored in the kit repository storage device and the 3D virtual simulation is based at least in part on the design specification;
   wherein descriptive properties and descriptive behaviors associated with objects are organized by part number and stored in part number records in a parts repository storage device accessible to the kit design tool, the method further comprising:
   e) identifying a first portion of the plurality of objects in the kit that match up to existing part number records in the parts repository storage device and a second portion that do not match up to existing part number records; and
   f) generating a part number record for each object of the second portion using an object design tool in the kit fulfillment environment, the kit fulfillment environment further comprising the parts repository storage device, wherein each part number record generated by the object design tool is based at least in part on one or more of the request for the kit, unstructured description, and structured description and includes the part number, descriptive properties, and descriptive behaviors of the corresponding object.

13. The method of claim 10 wherein the customer is provided with remote access to a web server configured to permit the customer to use a browser on the remote user device to access the web server to submit the request for the kit that results in the generating in a).

14. The method of claim 10 wherein 3D virtual models associated with objects are stored in a parts repository storage device accessible to the computer animation tool, the method further comprising:
   d) identifying a first portion of the plurality of objects in the kit that match up to existing 3D virtual models in the parts repository storage device and a second portion that do not match up to existing 3D virtual models; and
   e) generating a 3D virtual model for each object of the second portion using a computer graphics tool in the kit fulfillment environment, the kit fulfillment environment further comprising the parts repository storage device, wherein each 3D virtual model generated by the computer graphics tool is based at least in part on part numbers, descriptive properties, and descriptive behaviors of the corresponding object from one or more of the request for the kit, unstructured description, structured description, and part number record.

15. The method of claim 10 wherein the 3D virtual simulation includes an animation of a select assembly procedure for the kit and an animation of a select unpacking procedure for the kit, wherein the remote access provided in b) permits the customer to control the assembly and unpacking procedure animations using the remote user device in conjunction with the final review.

16. The method of claim 10 wherein the customer is provided with remote access to a web server configured to permit the customer to use a browser on the remote user device to access the web server to activate the 3D virtual simulation and control the visual rendering in conjunction with the final review;
   wherein the web server is configured to permit the customer to use the browser on the remote user device to request changes to the kit, submit comments on the kit, and provide final approval of the kit in conjunction with the final review.

17. An apparatus for use in fulfillment of a kit, comprising:
   a customer communication subsystem for receiving a request for a kit from a customer, wherein the kit comprises a plurality of objects which include a plurality of components and one or more receptacle;
   a kit repository storage device; and
   at least one computer device in operative communication with the customer communication subsystem and kit repository storage device for use in conjunction with: a) transforming an unstructured description of the kit into a structured description in response to the customer communication subsystem receiving the request for the kit, wherein the structured description includes a parts list identifying the kit and the plurality of objects, b) transforming the structured description of the kit into a design specification using a kit design tool, wherein the design specification includes the parts list and further defines the kit and objects using part numbers, descriptive properties, and descriptive behaviors, including 3D virtual models of objects in the kit, wherein the design specification is stored in the kit repository storage device, and c) generating a 3D virtual simulation of the kit based at least in part on the design specification using a computer animation tool, wherein the 3D virtual simulation is formed using the 3D virtual models of objects in the kit, wherein the 3D virtual simulation reflects a select spatial layout of the plurality of components packed in the one or more receptacle and includes an interactive animation that dynamically controls a visual rendering of the 3D virtual simulation in response to a user at a user device selectively manipulating the kit or at least one object, wherein the 3D virtual simulation is stored in the kit repository storage device;

wherein the customer is provided with remote access to the 3D virtual simulation via the customer communication subsystem such that the customer can use a remote user device to control the visual rendering for a final review of the kit;

wherein the kit is released for production and fulfillment of the request after receiving a final approval from the customer via the customer communication subsystem in conjunction with the final review.

18. The apparatus of claim 17, further comprising:

a parts repository storage device in which descriptive properties and descriptive behaviors associated with objects are organized by part number and stored in part number records accessible to the kit design tool;

wherein the at least one computer device is in operative communication with the parts repository storage device for use in conjunction with: d) identifying a first portion of the plurality of objects in the kit that match up to existing part number records in the parts repository storage device and a second portion that do not match up to existing part number records and e) generating a part number record for each object of the second portion of the plurality of objects using an object design tool, wherein each part number record generated by the object design tool is based at least in part on one or more of the request for the kit, unstructured description, and structured description and includes the part number, descriptive properties, and descriptive behaviors of the corresponding object.

19. The apparatus of claim 17, further comprising:

a parts repository storage device in which 3D virtual models associated with objects are stored and accessible to the kit design tool and computer animation tool;

wherein the at least one computer device is in operative communication with the parts repository storage device for use in conjunction with: d) identifying a first portion of the plurality of objects in the kit that match up to existing 3D virtual models in the parts repository storage device and a second portion that do not match up to existing 3D virtual models and e) generating a 3D virtual model for each object of the second portion of the plurality of objects using a computer graphics tool, wherein each 3D virtual model generated by the computer graphics tool is based at least in part on part numbers, descriptive properties, and descriptive behaviors of the corresponding object from one or more of the request for the kit, unstructured description, structured description, and part number record.

20. The apparatus of claim 17, the customer communication subsystem comprising:

a web server to which the customer is provided with remote access and configured to permit the customer to use a browser on the remote user device to access the web server to activate the 3D virtual simulation and control the visual rendering in conjunction with the final review.

\* \* \* \* \*